US007897463B2

(12) United States Patent
Yun et al.

(10) Patent No.: US 7,897,463 B2
(45) Date of Patent: Mar. 1, 2011

(54) METHODS OF FABRICATING VERTICAL TWIN-CHANNEL TRANSISTORS

(75) Inventors: Eun-Jung Yun, Seoul (KR); Sung-Young Lee, Gyeonggi-do (KR); Min-Sang Kim, Seoul (KR); Sung-Min Kim, Incheon (KR); Hye-Jin Cho, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/651,688

(22) Filed: Jan. 4, 2010

(65) Prior Publication Data
US 2010/0105181 A1  Apr. 29, 2010

Related U.S. Application Data

(62) Division of application No. 11/687,079, filed on Mar. 16, 2007, now abandoned.

(30) Foreign Application Priority Data

Aug. 7, 2006 (KR) .................................. 2006-74202

(51) Int. Cl.
*H01L 21/336* (2006.01)
(52) U.S. Cl. .......... 438/270; 438/156; 438/157; 438/154
(58) Field of Classification Search .......... 257/314–317, 257/330, 33; 438/201, 221, 257, 266, 259, 438/270, 271, 58
See application file for complete search history.

(56) References Cited

U.S. PATENT DOCUMENTS

| 4,845,537 A | 7/1989 | Nishimura et al. |
| 5,308,782 A * | 5/1994 | Mazure et al. ................ 438/154 |
| H1435 H | 5/1995 | Cherne et al. |
| 6,137,122 A | 10/2000 | Liaw et al. |
| 6,500,710 B2 | 12/2002 | Nakagawa |
| 6,504,755 B1 | 1/2003 | Katayama et al. |
| 7,259,048 B2 * | 8/2007 | Chaudhry et al. ............ 438/156 |
| 7,351,622 B2 * | 4/2008 | Buh et al. ...................... 438/157 |
| 7,491,608 B2 * | 2/2009 | Forbes .......................... 438/259 |
| 2006/0157683 A1 * | 7/2006 | Scheuerlein ..................... 257/4 |

OTHER PUBLICATIONS

Notice of Reasons for Refusal for corresponding Korean application No. 2006-74202; Jun. 25, 2007.
English translation of Notice of Reasons for Refusal for corresponding Korean application No. 2006-74202; Jun. 25, 2007.

* cited by examiner

*Primary Examiner* — Wai-Sing Louie
*Assistant Examiner* — Sue Tang
(74) *Attorney, Agent, or Firm* — Myers Bigel Sibley & Sajovec, P.A.

(57) ABSTRACT

A transistor includes first and second pairs of vertically overlaid source/drain regions on a substrate. Respective first and second vertical channel regions extend between the overlaid source/drain regions of respective ones of the first and second pairs of overlaid source/drain regions. Respective first and second insulation regions are disposed between the overlaid source/drain regions of the respective first and second pairs of overlaid source/drain regions and adjacent respective ones of the first and second vertical channel regions. Respective first and second gate insulators are disposed on respective ones of the first and second vertical channel regions. A gate electrode is disposed between the first and second gate insulators. The first and second vertical channel regions may be disposed near adjacent edges of the overlaid source/drain regions.

14 Claims, 45 Drawing Sheets

METHODS OF FABRICATING VERTICAL TWIN-CHANNEL TRANSISTORS

CROSS-REFERENCE TO RELATED APPLICATION

The present application is a divisional of and claims priority from U.S. patent application Ser. No. 11/687,079, filed Mar. 16, 2007 now abandoned, which claims the benefit of the benefit of Korean Patent Application No. 2006-74202, filed on Aug. 7, 2006, in the Korean Intellectual Property Office, the disclosure of which is incorporated herein in its entirety by reference.

BACKGROUND OF THE INVENTION

The present invention relates to semiconductor devices and methods of fabrication therefor, and more particularly, to nonvolatile memory devices and methods of fabrication therefor.

Field effect transistors (FETs) are widely used in integrated circuit memory devices. These field effect transistors may include metal oxide semiconductor FETs (MOSFETs) and variants thereof, such as floating gate transistors. A typical floating gate integrated circuit field effect transistor includes spaced apart source and drain regions, an active (channel-supporting) region therebetween and a gate structure including a tunnel oxide layer on the channel, a charge-retaining layer on the tunnel oxide layer, a dielectric layer on the floating gate layer, and a control gate electrode on the dielectric layer.

There has been an ever-present drive to increase the amount of memory capacity that can be provided in a given amount of space. Thus, the size of memory cells has been decreased. In addition, cell architectures that can increase effective use of wafer area, such as stackable cell architectures, have also been employed.

SUMMARY OF THE INVENTION

In some embodiments of the present invention, a transistor includes first and second pairs of vertically overlaid source/drain regions on a substrate. Respective first and second vertical channel regions extend between the overlaid source/drain regions of respective ones of the first and second pairs of overlaid source/drain regions. Respective first and second insulation regions are disposed between the overlaid source/drain regions of the respective first and second pairs of overlaid source/drain regions and adjacent respective ones of the first and second vertical channel regions. Respective first and second gate insulators are disposed on respective ones of the first and second vertical channel regions. A gate electrode is disposed between the first and second gate insulators. The first and second vertical channel regions may be disposed near adjacent edges of the overlaid source/drain regions.

In further embodiments, the transistor may include respective first and second channel extension regions disposed between the overlaid source/drain regions of the respective first and second pairs of overlaid source/drain regions and abutting respective ones of the first and second vertical channel regions. The first and second gate insulators may include opposing first and second portions of an insulation layer conforming to first and second sidewall surfaces and a bottom surface of the gate electrode. The transistor may further include an insulation region underlying the insulation layer and the gate electrode. The first and second gate insulators may each include a charge trap layer disposed between two insulation layers.

In additional embodiments, the transistor may include third and fourth source/drain regions overlaid on respective ones of the first and second pairs of overlaid source/drain regions. Third and fourth vertical channel regions may extend between respective ones of the third and fourth source/drain regions and upper source/drain regions of the respective first and second pairs of overlaid source/drain regions. Third and fourth gate insulators may be disposed on respective ones of the third and fourth vertical channel regions, a second gate electrode overlying the first gate electrode and extending between the third and fourth gate insulators. An insulation region may be disposed between the first and second gate electrodes.

In some embodiments, the transistor may include a device isolation region abutting outer edges of the first and second pairs of overlaid source/drain regions and contiguous with the first and second insulation regions. The transistor may further include a gate line structure disposed on a side of the device isolation region opposite one of the pairs of overlaid source/drain regions, the gate line structure extending substantially parallel to the gate electrode of the transistor.

Additional embodiments of the present invention provide methods of fabricating a transistor. Spaced-apart first and second stacks of interleaved patterns are formed on a substrate, each of the first and second stacks of interleaved patterns including at least two semiconductor patterns with at least one sacrificial pattern therebetween. Respective first and second vertical semiconductor layers are formed conforming to respective opposing sidewalls of the at least two semiconductor patterns and the at least one sacrificial pattern of respective ones of the first and second stacks of interleaved patterns. Respective first and second gate insulators are formed on respective ones of the first and second vertical semiconductor layers. A conductive gate electrode region is formed extending between the first and second gate insulators. The at least one sacrificial pattern is removed from each of the first and second stacks of interleaved patterns to form gaps between the at least two semiconductor patterns of the stacks of interleaved patterns. Respective insulation regions are formed in respective ones of the gaps.

In some embodiments, forming spaced-apart first and second stacks of interleaved patterns may include forming interleaved semiconductor and sacrificial layers on the substrate, patterning the semiconductor and sacrificial layers to form a trench defining, an active region, forming a trench isolation region in the trench, and forming a trench bisecting the interleaved layers in the active region to form the spaced-apart first and second stacks of interleaved patterns. Removing the at least one sacrificial pattern from each of the first and second stacks of interleaved patterns may include removing portions of the trench isolation region adjacent outer sidewalk of the first and second stacks of interleaved patterns to expose the at least one sacrificial pattern, and etching the exposed at least one sacrificial pattern.

According to further embodiments, forming a trench bisecting the interleaved layers in the active region may include forming spaced-apart first and second mask regions on the interleaved layers in the active region and etching the interleaved layers in the active region using the first and second mask regions as an etching mask. Forming respective first and second vertical semiconductor layers may include forming a semiconductor layer on exposed surfaces of the bisecting trench. Forming respective first and second gate insulators may include forming a first insulation layer on the semiconductor layer and the first and second mask regions. Forming a conductive gate electrode region extending between the first and second gate insulators may include forming a conductive region in the bisecting trench between the first and second stacks of interleaved patterns. Removing portions of the trench isolation region adjacent outer sidewalls of the first and second stacks of interleaved patterns may be preceded by forming a second insulation layer covering the conductive gate electrode region and the first insulation region, and planarizing to remove portions of the first insulation layer, the second insulation layer and the first and second mask regions and thereby expose upper patterns of the first and second stacks of interleaved patterns and the trench isolation region. Forming a first insulation layer may be preceded by forming an insulation region on the semiconductor layer at the bottom of the bisecting trench. Forming a first insulation layer may include forming the first insulation layer on the insulation region at the bottom of the trench.

In additional embodiments, forming interleaved semiconductor and sacrificial layers on the substrate may include sequentially forming a first semiconductor layer, a first sacrificial layer and a second semiconductor layer. Patterning the semiconductor and sacrificial layers to form a trench defining an active region may include patterning the first semiconductor layer, the first sacrificial layer and the second semiconductor layer to form the trench. Forming a trench bisecting the interleaved layers may include forming a trench bisecting the first semiconductor layer, the first sacrificial layer and the second semiconductor layer in the active region to form spaced-apart first and second stacks of interleaved patterns, each of which includes a first semiconductor pattern, a first sacrificial pattern on the first semiconductor pattern and a second semiconductor pattern on the first sacrificial pattern. Removing the at least one sacrificial pattern from each of the first and second stacks of interleaved patterns may include removing portions of the trench isolation region adjacent outer sidewalls of the first and second stacks of interleaved patterns to expose the first sacrificial pattern. and etching the exposed first sacrificial pattern.

Forming interleaved semiconductor and sacrificial layers on the substrate may include sequentially forming a first semiconductor layer, a first sacrificial layer, a second semiconductor layer, a second sacrificial layer and a third semiconductor layer. Patterning the semiconductor and sacrificial layers to form a trench defining an active region may include patterning the first semiconductor layer, the first sacrificial layer, the second semiconductor layer, the second sacrificial layer and the third semiconductor layer to form the trench. Forming a trench bisecting the interleaved layers may include forming a trench bisecting the first semiconductor layer, the first sacrificial layer, the second semiconductor layer, the second sacrificial layer and the third semiconductor layer in the active region to form the spaced-apart first and second stacks of interleaved patterns, each of which include a first semiconductor pattern, a first sacrificial pattern on the first semiconductor pattern, a second semiconductor pattern on the first sacrificial pattern, a second sacrificial pattern on the second semiconductor patterns and a third semiconductor pattern on the second sacrificial pattern. Removing the at least one sacrificial pattern from each of the first and second stacks of interleaved patterns may include removing portions of the trench isolation region adjacent outer sidewalls of the first and second stacks of interleaved patterns to expose the first sacrificial pattern and the second sacrificial pattern, and etching the exposed first and second sacrificial patterns.

In further embodiments, forming spaced-apart first and second stacks of interleaved patterns may include forming spaced apart first, second, third and fourth stacks of interleaved patterns, each including at least two semiconductor patterns with at least one sacrificial pattern therebetween, the first and second stacks of interleaved patterns disposed between the third and fourth stacks of interleaved patterns. Forming respective first and second vertical semiconductor layers may include forming vertical semiconductor layers conforming to sidewalls of the first, second, third and fourth stacks of interleaved patterns. Forming respective first and second gate insulators on respective ones of the first and second vertical semiconductor layers may include forming a first insulation layer covering the vertical semiconductor layers. Forming a conductive gate electrode region extending between the first and second gate insulators may include forming a first conductive region in a trench between the first and second stacks of interleaved patterns, a second conductive region in a trench between the first and third stacks of interleaved patterns, and a third conductive region between the second and fourth stacks of interleaved patterns. Removing the at least one sacrificial pattern from each of the first and second stacks of interleaved patterns may include forming a second insulation layer covering the first, second and third conductive regions and the first insulation layer, removing portions of the second insulation layer, the first insulation layer, and the first and second stacks of interleaved patterns adjacent the second and third conductive regions to expose at least one sacrificial pattern from each of the first and second stacks of interleaved patterns, and etching the exposed at least one sacrificial pattern from each of the first and second stacks of interleaved patterns.

In some embodiments, methods may include doping the semiconductor patterns prior to forming the first and second vertical channel regions. In further embodiments, methods may include doping the semiconductor patterns following formation of the gate electrode and prior to forming the respective insulation regions in the respective ones of the gaps. In additional embodiments, methods may include doping the semiconductor patterns after forming the respective insulation regions in the respective ones of the gaps.

Additional embodiments of the present invention provide methods of forming a transistor array. A stack of interleaved layers is formed including at least two semiconductor layers with at least one sacrificial layer therebetween. The stack of interleaved layers is patterned to form spaced apart first, second, third and fourth stacks of interleaved patterns, each including at least two semiconductor patterns with at least one sacrificial pattern therebetween, the first and second stacks of interleaved patterns disposed between the third and fourth stacks of interleaved patterns. Vertical semiconductor layers are formed on sidewalls of the first, second, third and fourth stacks of interleaved patterns. A gate insulation layer is formed covering the vertical semiconductor layers and the first, second, third and fourth stacks of interleaved patterns. A first gate electrode is formed on the gate insulation layer between the first and third stacks of interleaved patterns, a second gate electrode on the gate insulation layer between on the first and second stacks of interleaved patterns, and a third gate electrode on the gate insulation layer between the second and fourth stacks of interleaved patterns. An insulation layer is formed covering the first, second and third gate electrodes and the gate insulation layer. Portions of the insulation layer, the gate insulation layer and portions of the first and second stacks of interleaved patterns adjacent the first and third gate electrodes are removed to expose at least one sacrificial layer in each of the first and second stacks of interleaved patterns. The exposed at least one sacrificial layer in each of the first and second stacks of interleaved patterns is removed to form gaps between semiconductor layers thereof. Insulation regions are formed in the gaps.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF EMBODIMENTS OF THE INVENTION

Figure 1:
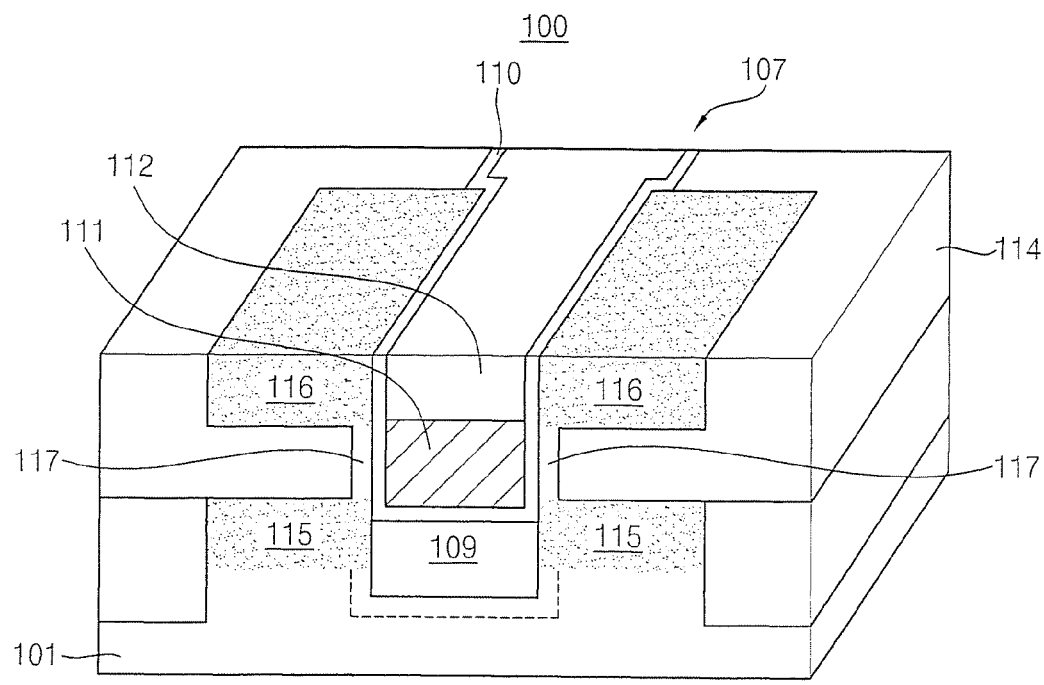
FIG. 1 illustrates a transistor according to some embodiments of the present invention.

The present invention will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. As used herein the term "and/or" includes any and all combinations of one or more of the associated listed items.

The terminology used herein is for the purpose of describing particular embodiments and is not intended to be limiting of the invention. As used herein, the singular forms "a", "an" and "the" are intended to include the plural forms as well, unless the context clearly indicates otherwise. It will be further understood that the terms "includes" and/or "including," when used in this specification, specify the presence of stated features, integers, steps, operations, elements, and/or components, but do not preclude the presence or addition of one or more other features, integers, steps, operations, elements, components, and/or groups thereof.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Embodiments of the present invention are described herein with reference to perspective illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated or described as a rectangle will, typically, have rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. It will also be appreciated by those of skill in the art that references to a structure or feature that is disposed "adjacent" another feature may have portions that overlap or underlie the adjacent feature.

FIG. 1 illustrates a vertical twin-channel transistor 100 according to some embodiments of the present invention. The transistor 100 includes a substrate 101 with a trench 107 therein. A first insulation region 109 is disposed in a bottom of the trench 107. A gate insulation layer 110 conforms to a top surface of the first insulation region 109 and adjacent sidewalls of the trench 107. In some embodiments, the gate insulation layer 110 may be a multilayer structure including a charge trap layer, e.g., to support non-volatile data storage. A gate electrode 111 is disposed on gate insulation layer 110 in the trench 107. A second insulation region 112 is disposed on the gate electrode 111.

Vertically overlaid spaced-apart source/drain regions 115, 116 are disposed on respective sides of the gate electrode 111. Respective vertically overlaid source/drain regions 115, 116 are connected by respective vertical channel regions, 117. Respective insulation regions 114 are interposed between respective vertically overlaid source/drain regions 115, 116, adjacent the channel regions 117.

Figure 2:
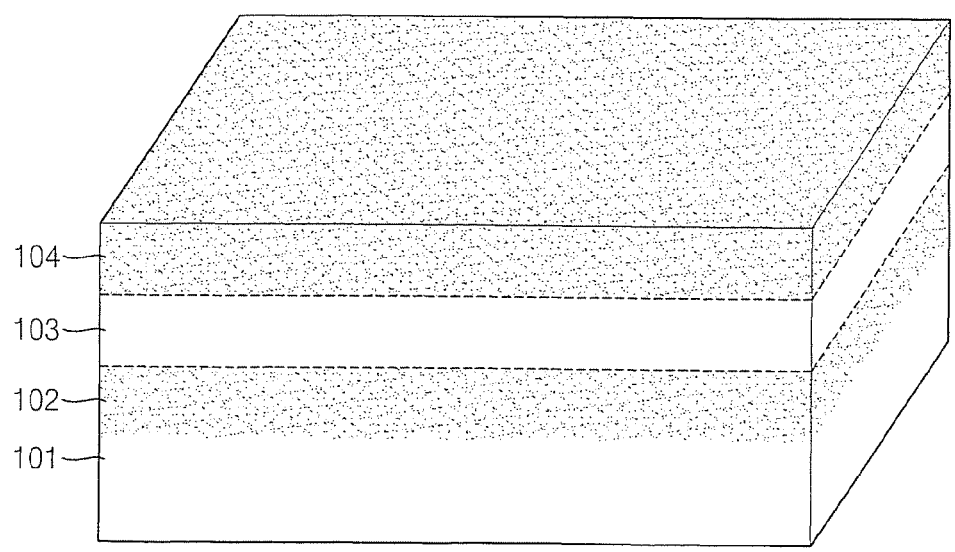
FIGS. 2-13 illustrate fabrication products and operations for forming the transistor of FIG. 1.
Figure 3:
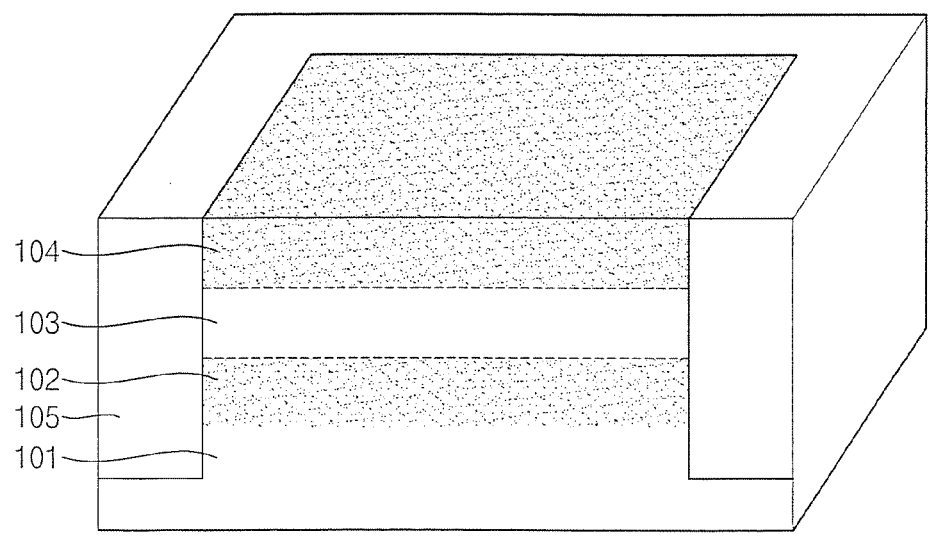

FIGS. 2-13 illustrate exemplary operations for forming the transistor 110 of FIG. 1. Referring to FIG. 2, a first crystalline silicon layer 102 is formed on a substrate 101 using, for example, an epitaxial process. A sacrificial layer 103, e.g., a silicon-germanium (SiGe) layer, is formed on the silicon layer 102. A second crystalline silicon layer 104 is formed on the sacrificial layer 103. Referring to FIG. 3, the substrate 101, first silicon layer 102, sacrificial layer 103 and second silicon layer 104 are patterned to form a trench, which is filled with an insulating material to form a shallow-trench isolation (STI) region 105. The STI region 105 extends beneath the interface of the substrate 101 and the first silicon layer 102.

Figure 4:
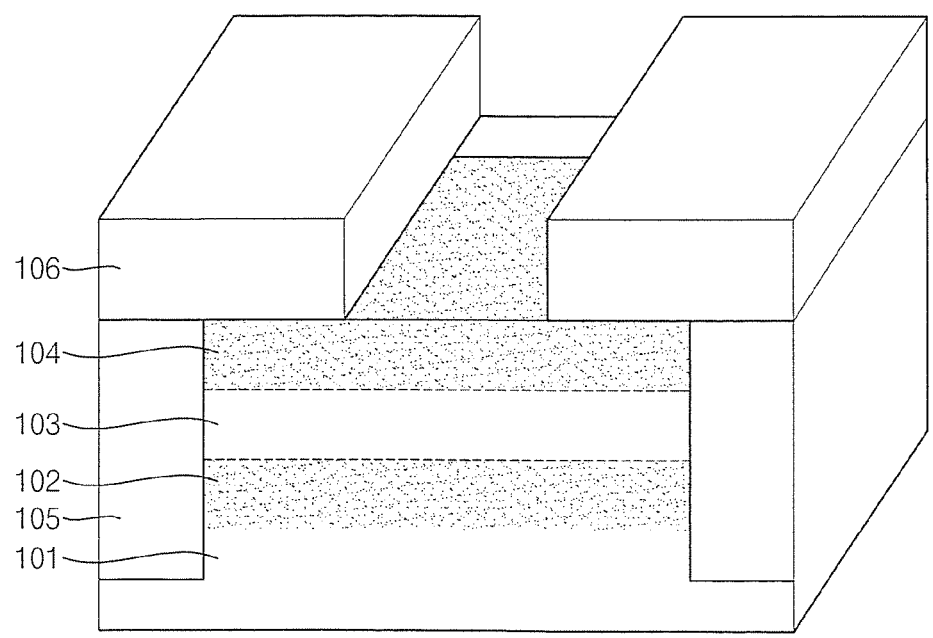
Figure 5:
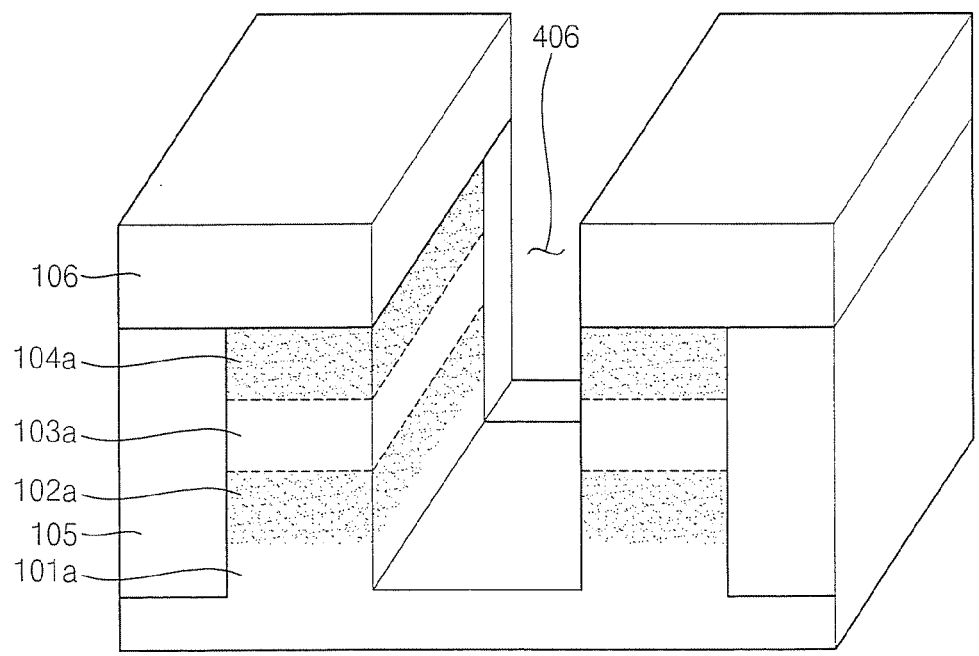

Referring to FIG. 4, a hard mask layer, e.g., a silicon nitride layer, is formed on the resultant structure and patterned to formed spaced apart mask regions 106. Referring to FIG. 5, portions of the substrate 101, first silicon layer 102, sacrificial layer 103 and second silicon layer 104 are removed using the mask regions 106 as an etching mask, thus forming a trench 107 that separates stacks of patterns, including a first semiconductor pattern 101a, a second semiconductor pattern 102a, a sacrificial pattern 103a, and a third semiconductor pattern 104a.

Figure 6:
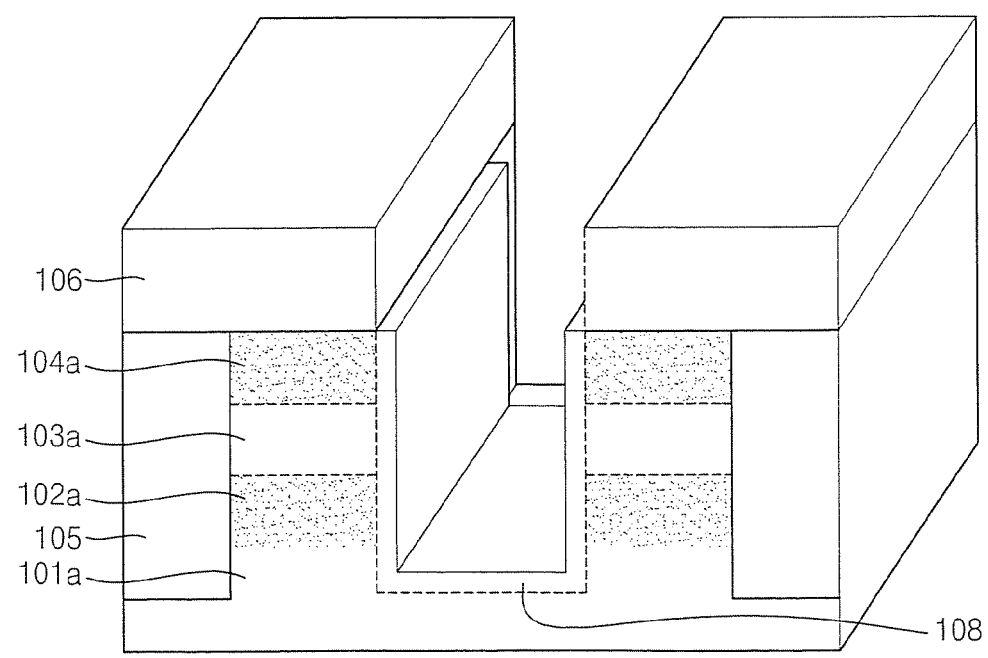
Figure 7:
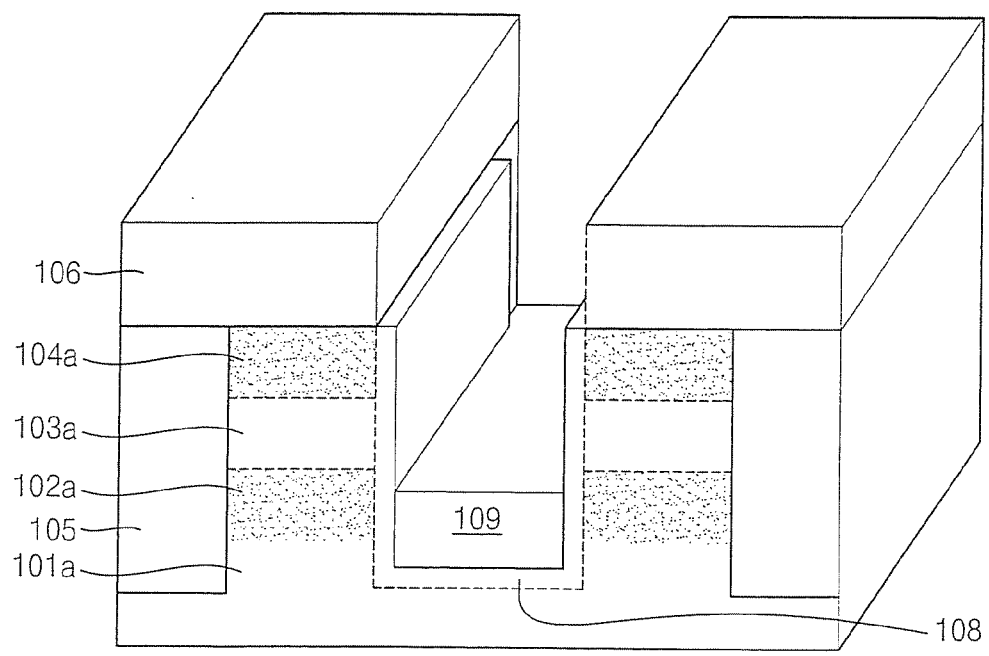

As shown in FIG. 6, an epitaxial process may then be used to form a crystalline silicon layer 108 on the bottom and sidewalls of the trench 107. A first insulation region 109 may then be formed on the silicon layer 108 at the bottom of the trench 107, as shown in FIG. 7. The first insulation region 109 has a height below the top surface of the second semiconductor pattern 102a.

Figure 8:
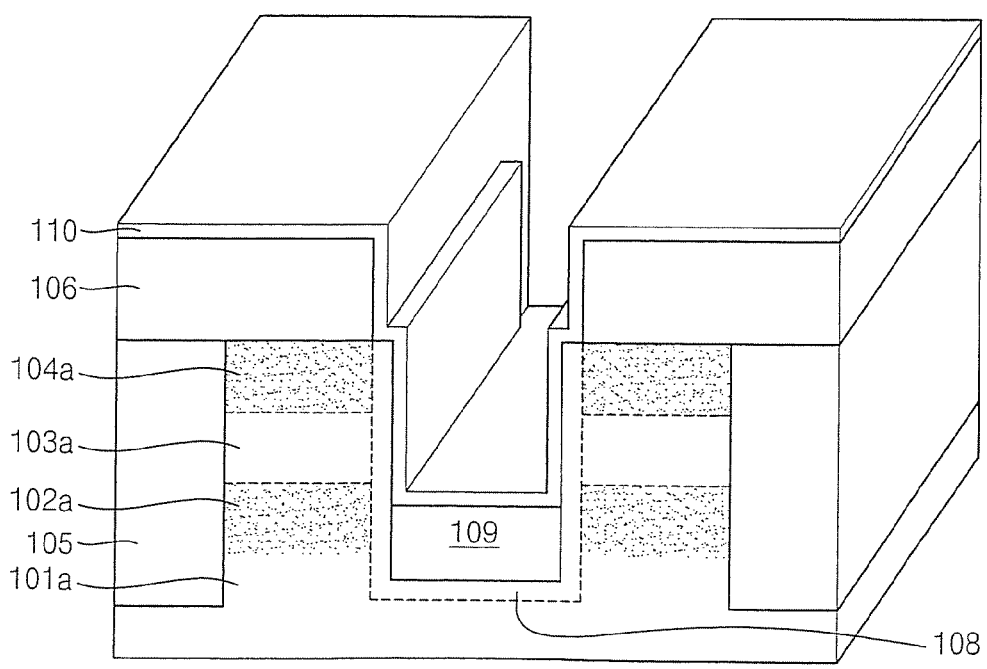
Figure 9:
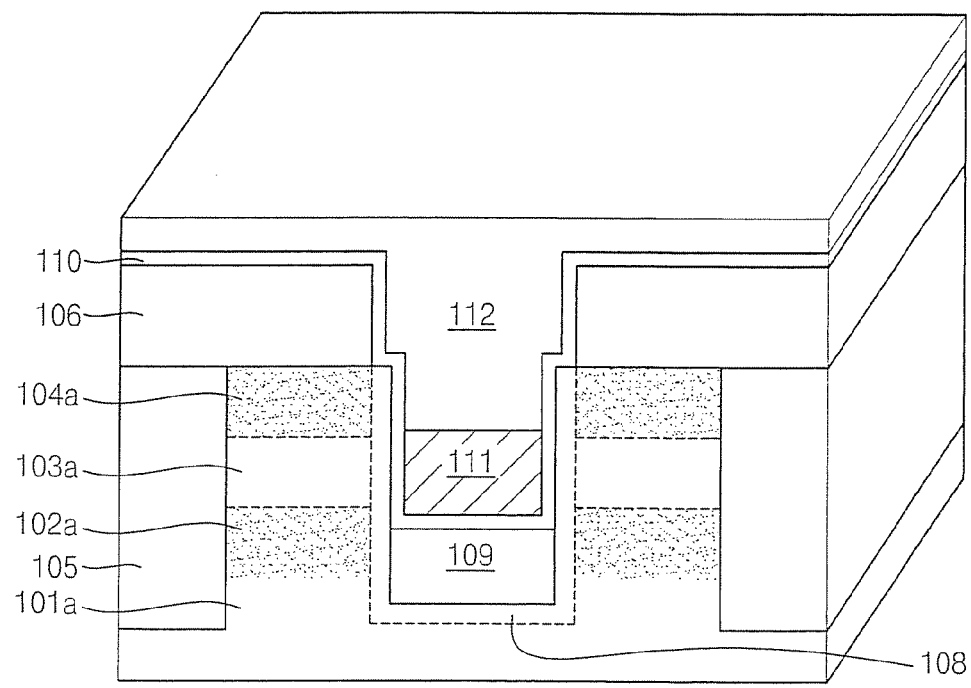
Figure 10:
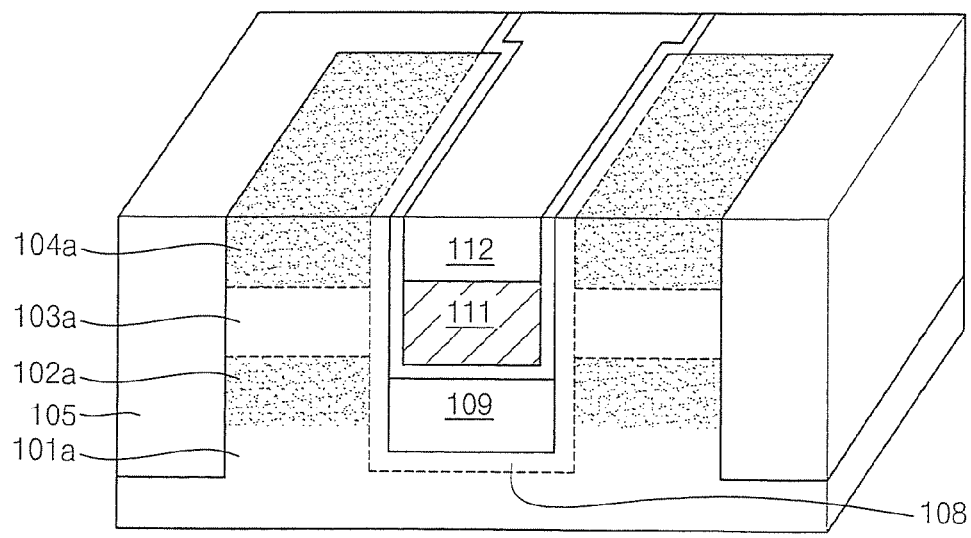

Referring to FIG. 8, a gate insulation layer 110 is formed on the resultant structure, covering the first insulation layer 109, adjacent portions of the silicon layer 108 and the mask regions 106. The gate insulation layer 110 may include, for example, a single insulation layer or a multilayer structure including, for example, an oxide-nitride-oxide (ONO) structure. As shown in FIG. 9, a gate electrode 111 is formed on the gate insulation layer 110, and a second insulation layer 112 is formed on the gate electrode 111. The second insulation layer 112 is planarized, as shown in FIG. 10.

Figure 11:
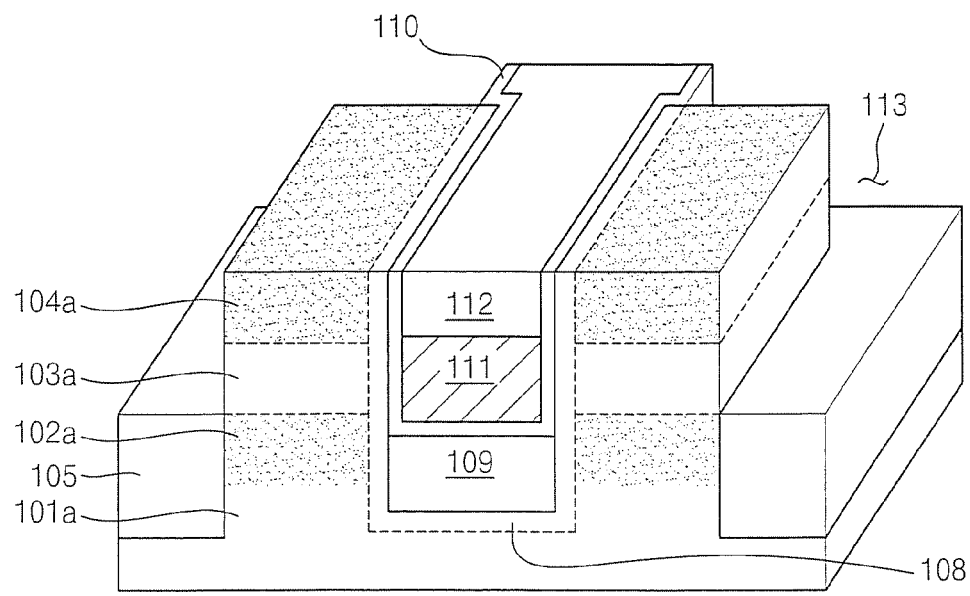
Figure 12:
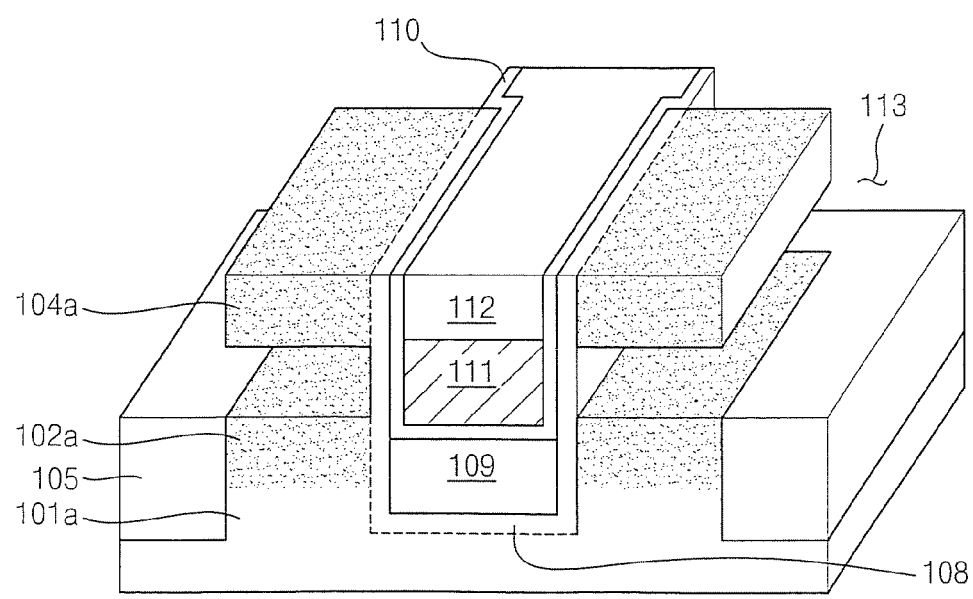
Figure 13:
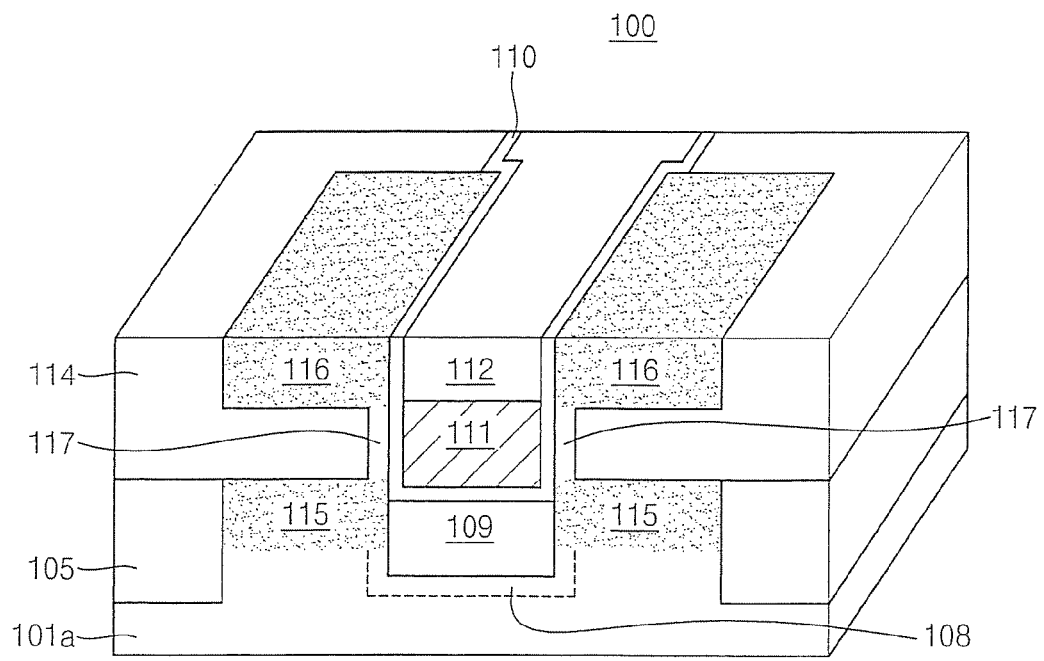

Referring to FIG. 11, portions of the STI region 105 are removed to form a trench 113 that exposes the sacrificial patterns 103a. As shown in FIG. 12, the sacrificial patterns 103a may then be removed using, for example, a wet etch, to form gaps between the second semiconductor patterns 102a and the third semiconductor patterns 104a. As shown in FIG. 13, an insulation layer 114 is then formed that fills the gaps. Source/drain regions 115, 116 may be formed by ion-implantation of the second and third semiconductor patterns 102a, 104a and adjoining portions of the silicon layer 108, leaving vertical channel regions 117 extending between overlapping ones of the source/drain regions 115, 116.

Figure 14:
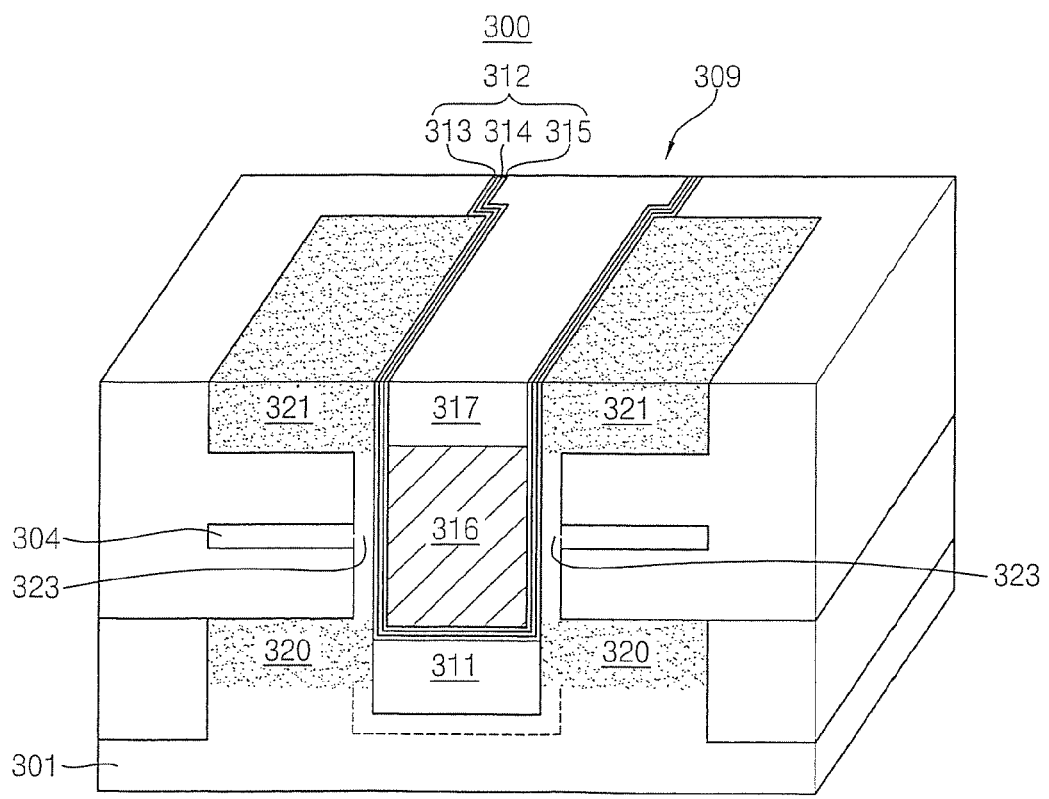
FIG. 14 illustrates a transistor according to some embodiments of the present invention.

FIG. 14 illustrates a transistor 300 according to further embodiments of the present invention. The transistor 300 includes a substrate 301 having trench 309 therein. A first insulation region 311 is disposed at the bottom of the trench 309. A multilayer gate insulator 312 is disposed on the first insulation region 311 and adjacent sidewalls of the trench 309, and includes a nitride layer 314 disposed between first and second oxide layers 313, 315. A gate electrode 316 is disposed on the gate insulator 312 in the trench 309. A second insulation region 317 is disposed on the gate electrode 316. Overlaid source/drain regions 320, 321 are disposed on respective sides of the gate electrode 316, and are joined by respective vertical channel regions 323. Crystalline silicon interlayer regions 304 are disposed between the overlaid source/drain regions 320, 321. Interlayer regions 304 may increase channel length and support multi-bit operation in memory applications.

Figure 15:
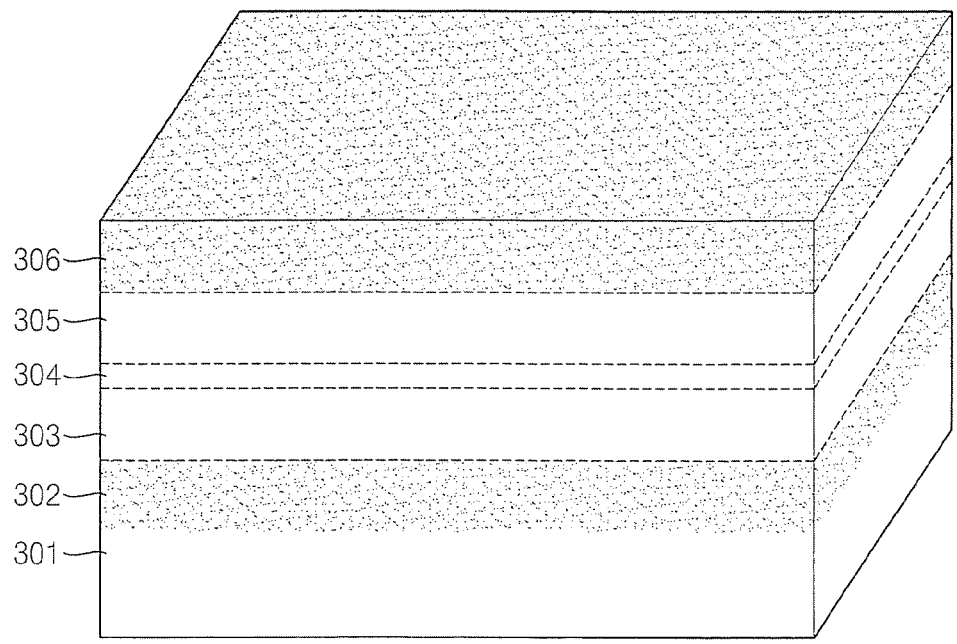
FIGS. 15-26 illustrate fabrication products and operations for forming the transistor of FIG. 14.
Figure 16:
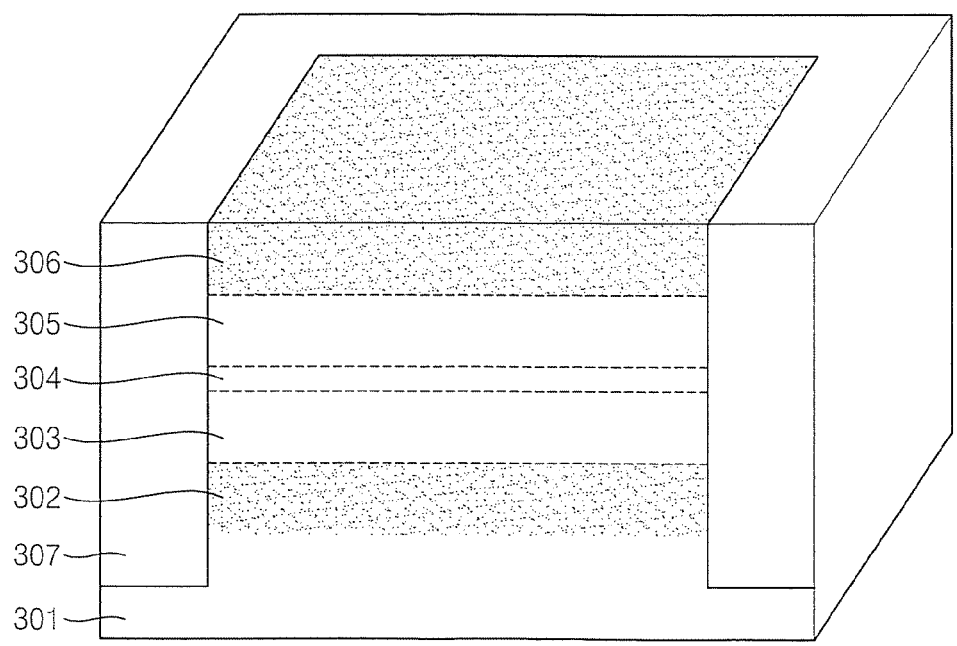

FIGS. 15-26 illustrate operations for forming the transistor 300 of FIG. 14. Referring to FIG. 15, a first crystalline semiconductor layer 302, a first sacrificial layer 303, a second crystalline silicon layer 304, a second sacrificial layer 305 and a third crystalline semiconductor layer 306 are sequentially formed on a substrate 301. The substrate 301 and overlying layers 302-306 are patterned to form a trench, which is filled with an insulating material to form an STI region 307, as shown in FIG. 16.

Figure 17:
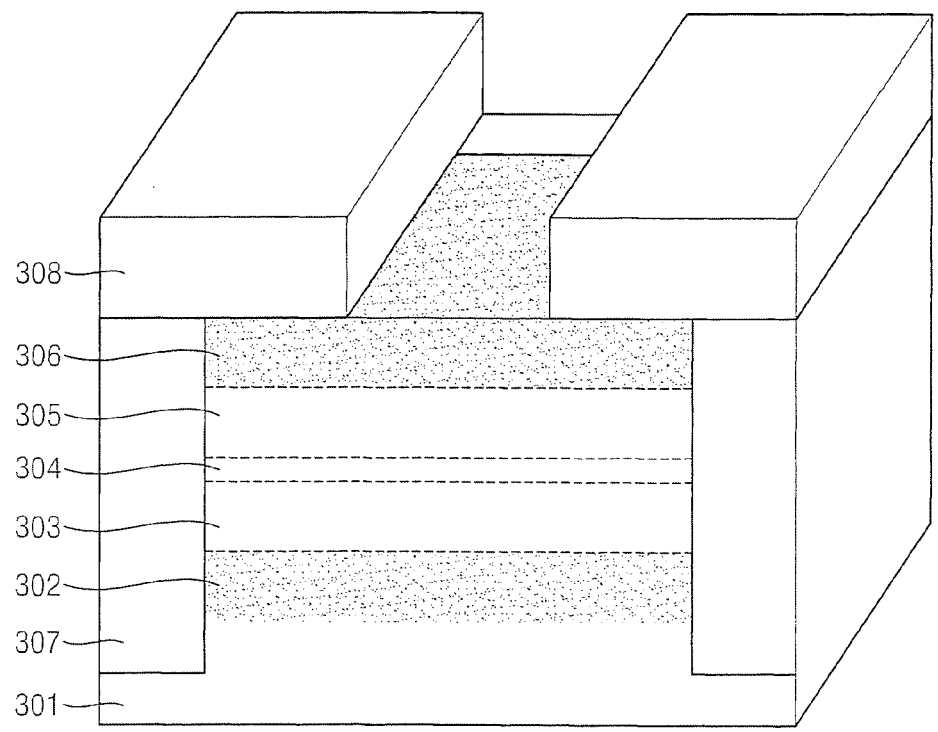
Figure 18:
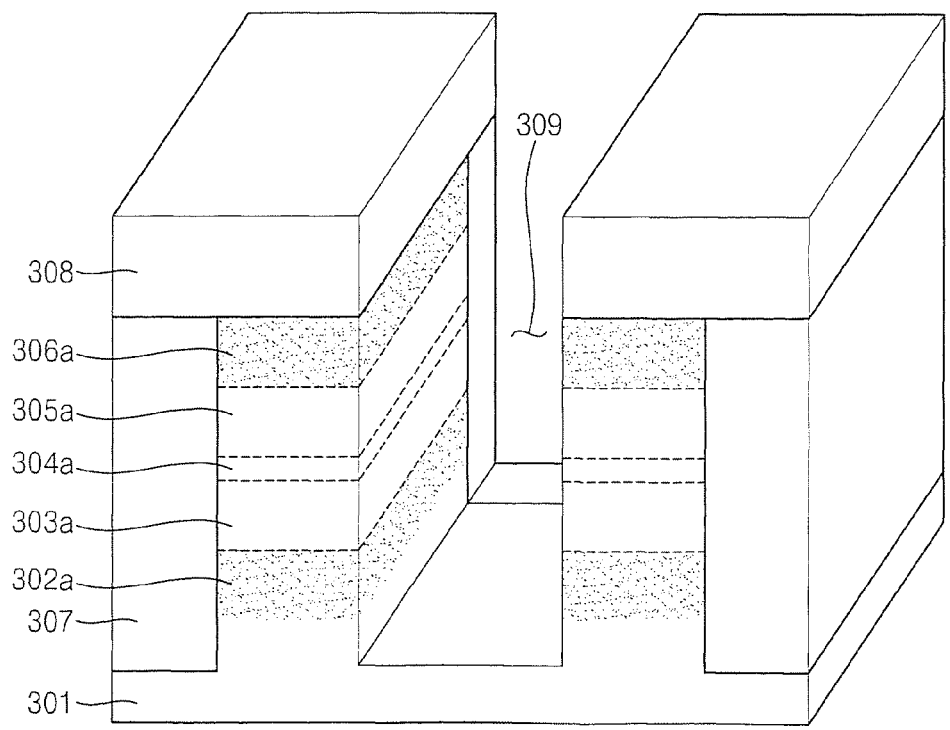

Referring to FIG. 17, a hard mask layer is formed and patterned to form spaced-apart mask regions 308 that overlie the STI region 307 and portions of the stacked layers. As shown in FIG. 18, portions of the substrate 301 and overlying layers 302-306 are then removed to form a trench 309 between spaced-apart stacks of patterns, each including a first semiconductor pattern 301a, a second semiconductor pattern 302a, a first sacrificial pattern 303a. a third semiconductor pattern 304a, a second sacrificial pattern 305a, and a fourth semiconductor pattern 306a.

Figure 19:
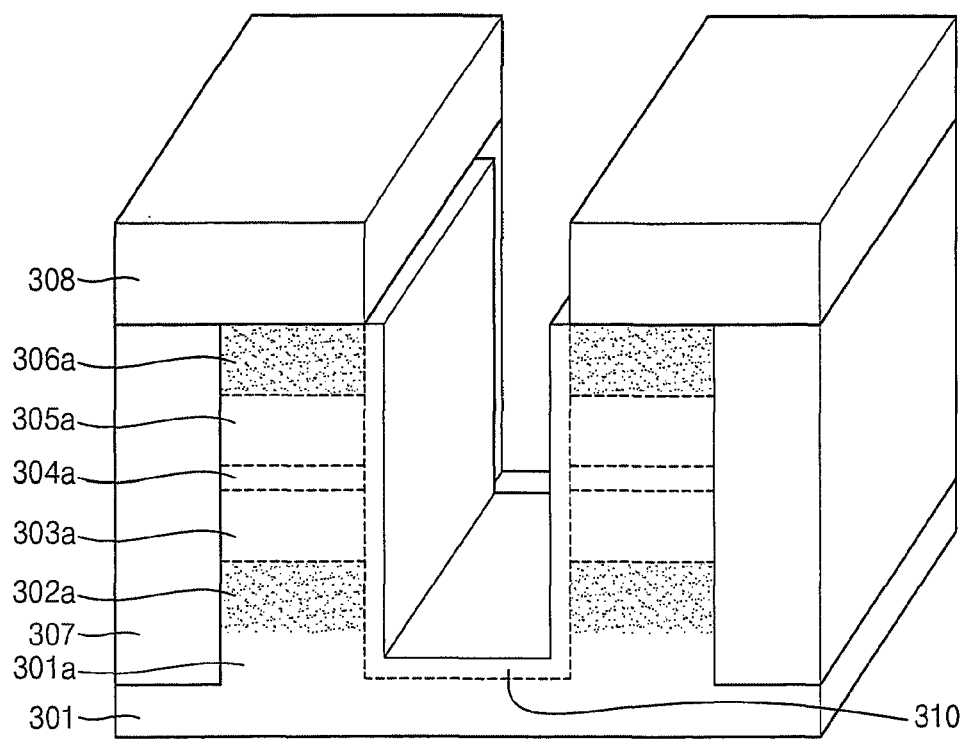
Figure 20:
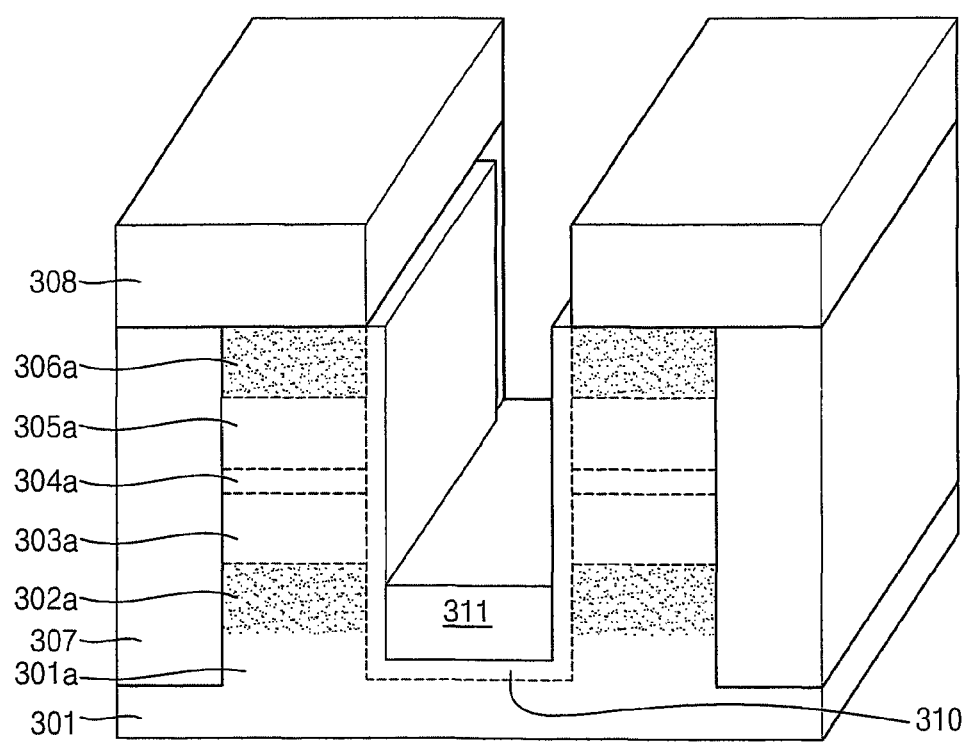

As shown in FIG. 19, a crystalline silicon layer 310 is formed on bottom and sidewalls of the trench 309. Referring to FIG. 20, a first insulation region 311 is formed on the silicon layer 310 at the bottom of the trench 309. The top surface of the first insulation layer 311 is below the top surface of the second semiconductor pattern 302a.

Figure 21:
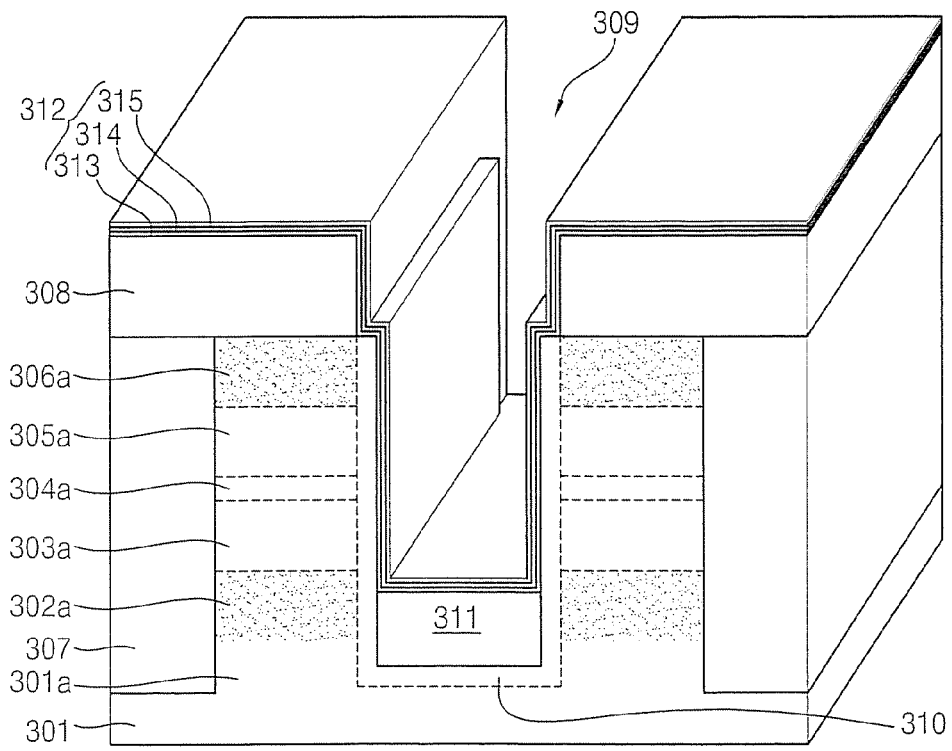
Figure 22:
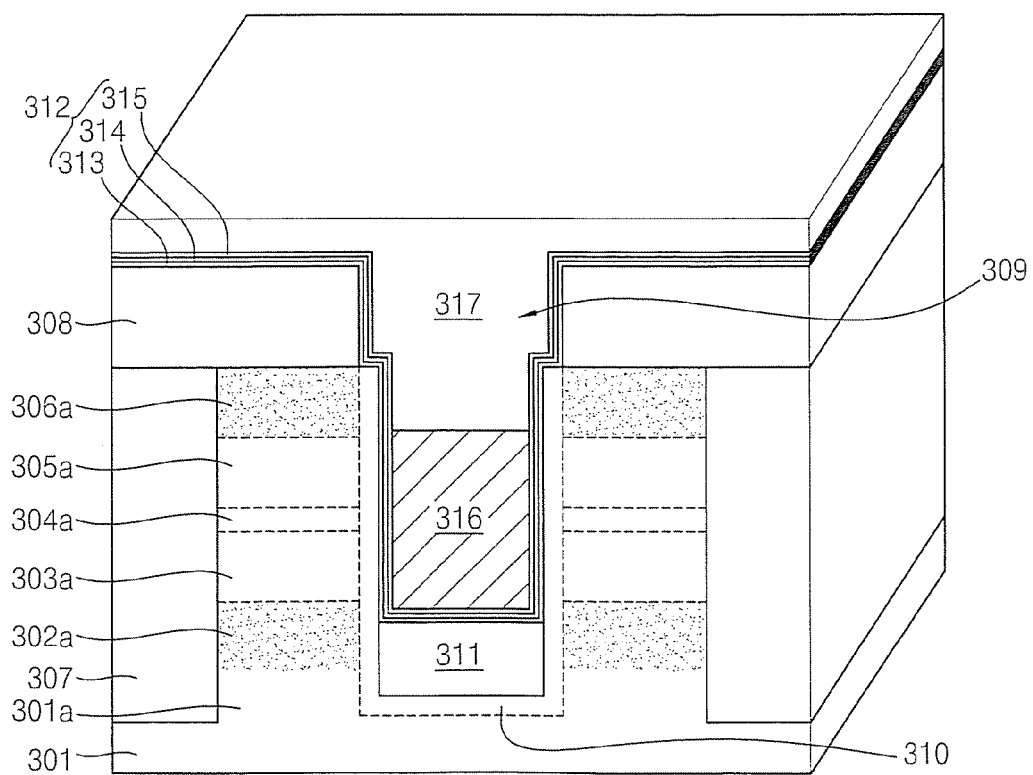
Figure 23:
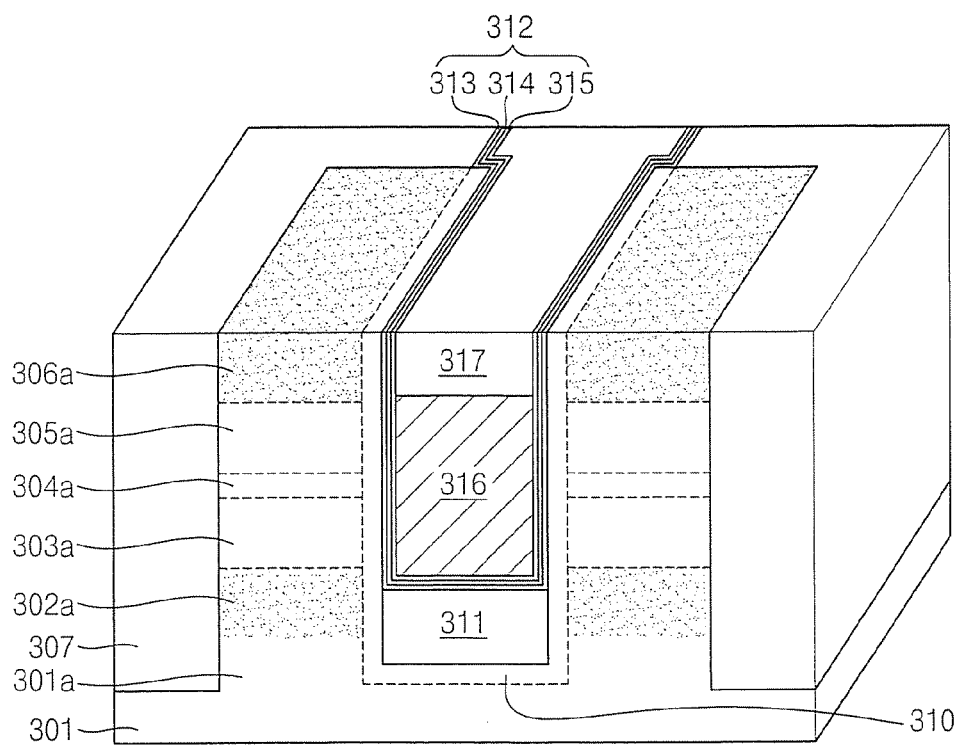

Referring to FIG. 21, a gate insulator layer 312, including oxide layers 313, 315 and interposed nitride layer 314, is formed on the resulting structure. As shown in FIG. 22, a gate electrode 316 is formed on the gate insulator layer 312 in the trench 309, and an insulation layer 317 formed thereon. As shown in FIG. 23, the gate insulator layer 312 and insulation layer 317 are planarized to expose the fourth semiconductor patterns 306a.

Figure 24:
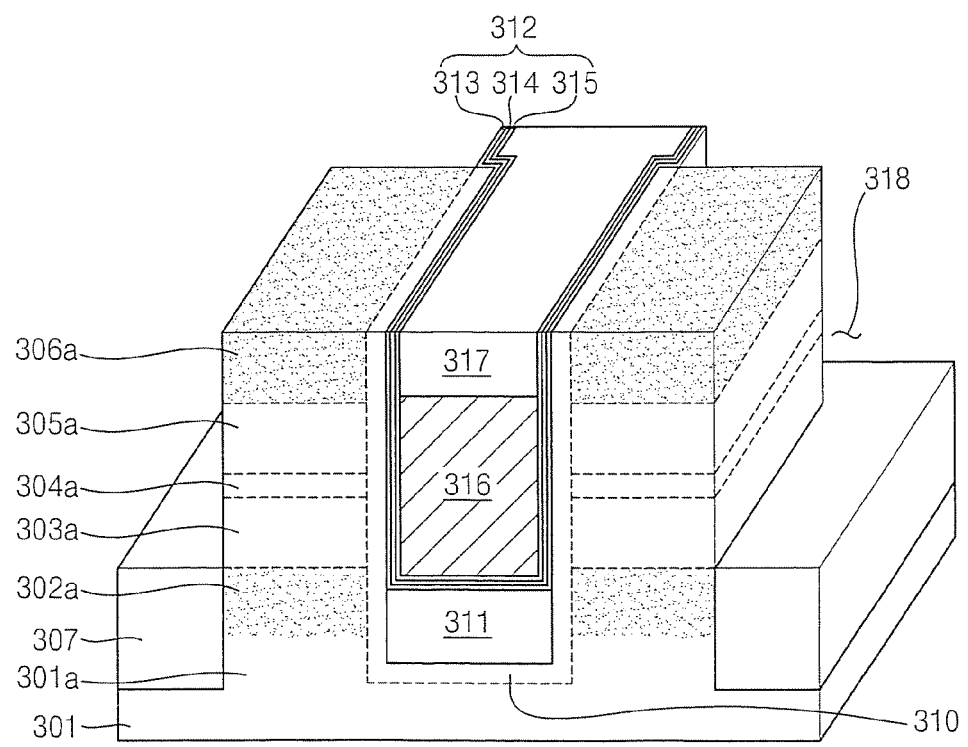
Figure 25:
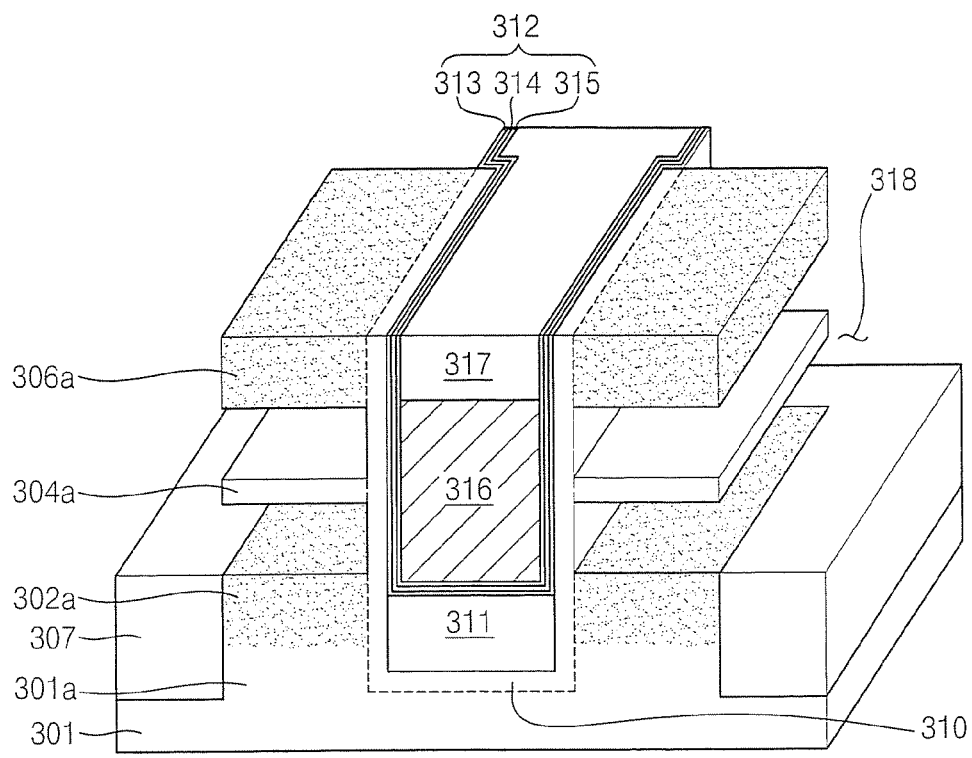
Figure 26:
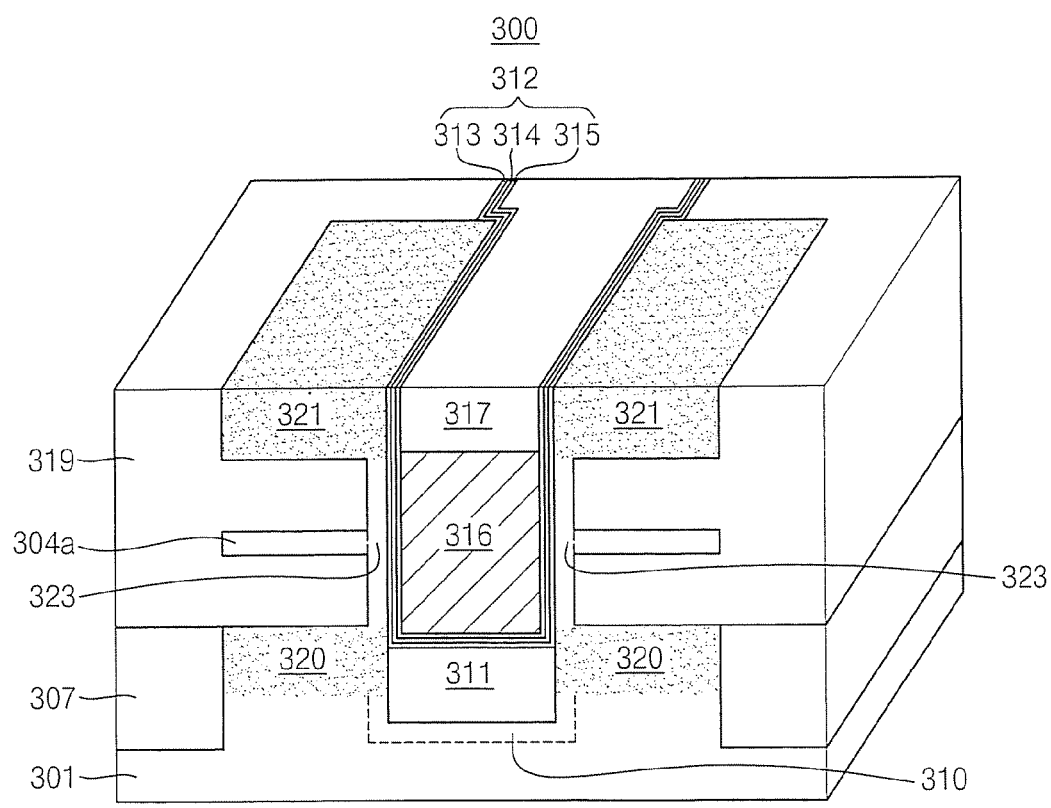

Referring to FIG. 24, portions of the STI region 307 are removed to expose the first and second sacrificial patterns 303a, 305a. As shown in FIG. 25, the sacrificial patterns 303a, 305a are removed by wet etching to leave gaps between the second and third semiconductor patterns 302a, 304a and between the third and fourth semiconductor patterns 304a, 306a. These gaps are filled with an insulating material to form insulation regions 319, as shown in FIG. 26. The second and fourth semiconductor patterns 302a, 306a and adjoining portions of the silicon layer 310 are ion implanted to form source/drain regions 320, 321 connected by vertical channel regions 323.

Figure 27:
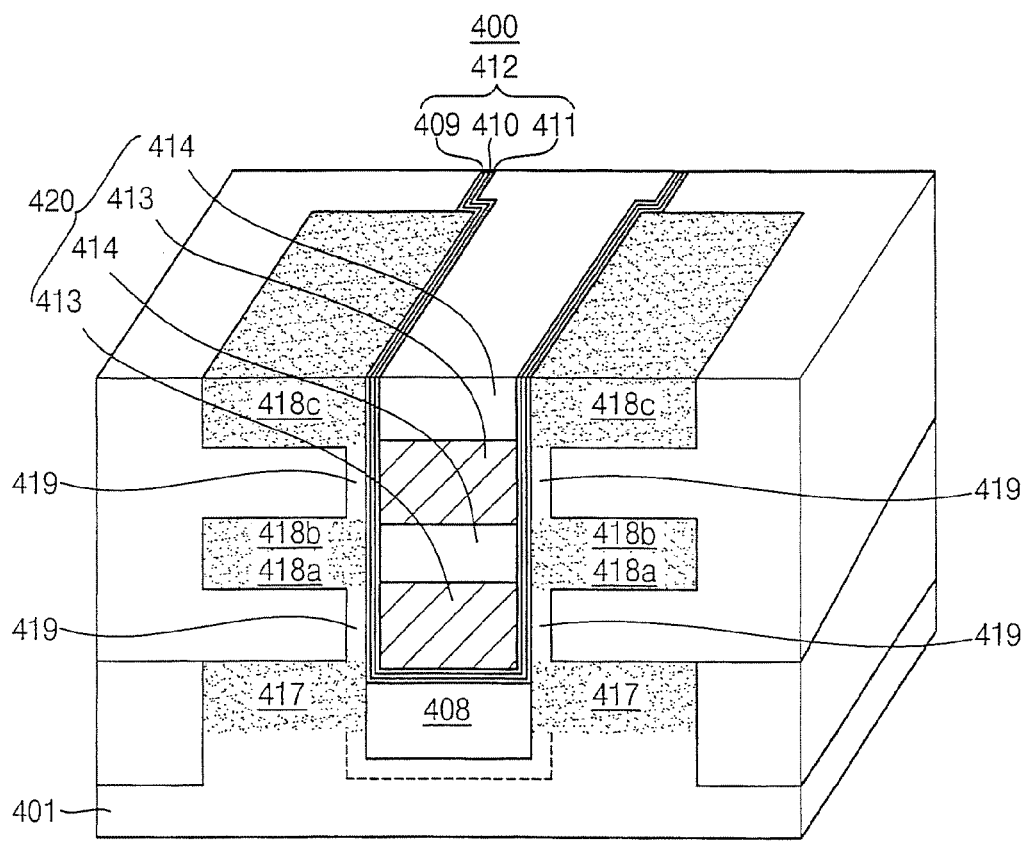
FIG. 27 illustrates a transistor according to some embodiments of the present invention.

FIG. 27 illustrates a transistor 400 according to further embodiments of the present invention. The transistor 400 has stacked vertical twin channels 419 that connect adjacent overlaid source/drain regions 417, 418a, 418b, 418c disposed on a substrate 401. Multiple gate electrodes 413 are disposed between the source/drain regions 417, 418a, 418b, 418c on gate insulation layer 412 including oxide layers 409, 411 and an intervening nitride layer 410. A first insulation region 408 is disposed beneath a lower one of the gate electrodes 413, a second insulation region 414 is disposed between the gate electrodes 413 and a third insulation region 414 is disposed on the upper one of the gate electrodes 413.

Figure 28:
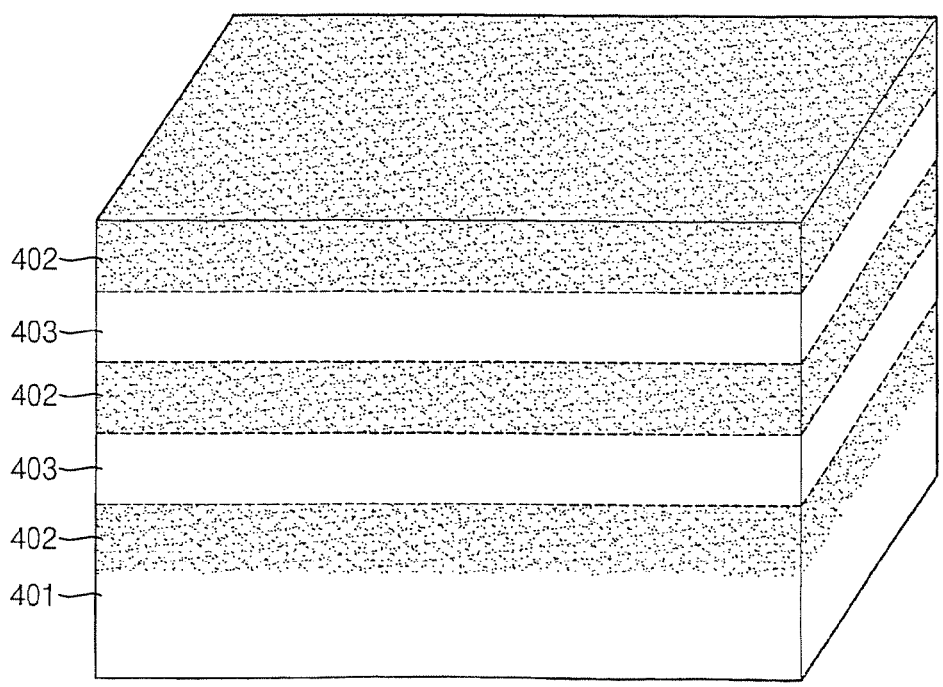
FIGS. 28-33 illustrate fabrication products and operations for forming the transistor of FIG. 27.
Figure 29:
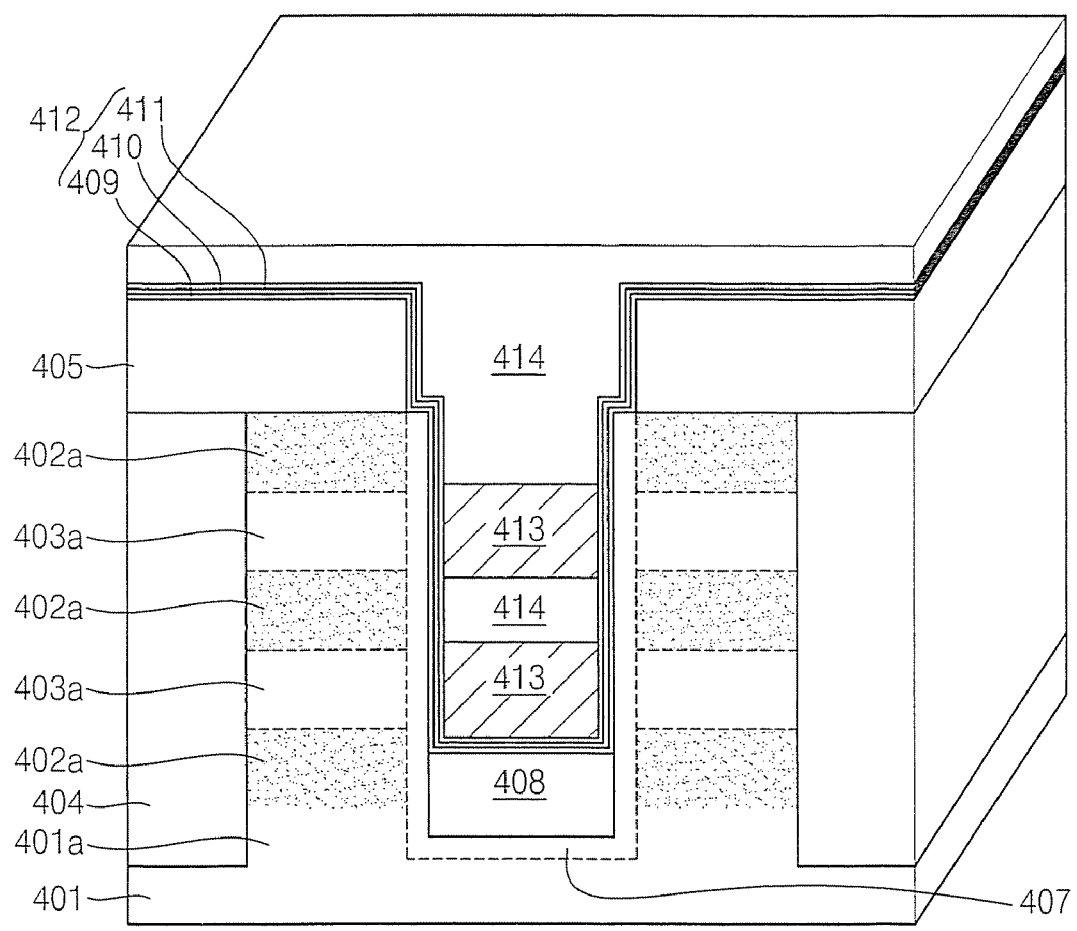

FIGS. 28-33 illustrate operations for forming the transistor 400 of FIG. 27. Referring to FIG. 28, alternating silicon and sacrificial layers 402, 403 are formed on a substrate 401. Referring to FIG. 29, using techniques along lines described above, the substrate 401 and layers 402, 403 are patterned to form a trench in which an STI region 404 is formed. Spaced-apart mask regions 405 are formed on the layers 402, 403 and used to form a trench that defines spaced-apart stacks of layers including a substrate pattern 401a and alternating silicon and sacrificial patterns 402a, 403a. A silicon layer 407 is formed in the trench, and a first insulation region 408 is formed at on the silicon layer 407 at the bottom of the trench. A multilayer gate insulator layer 412 including oxide layers 409, 411 and an intervening nitride layer 410 is formed on the first insulation layer 408 and sidewall surfaces of the trench. Gate electrodes 413 and second and third insulation regions 414 are formed on the gate insulator layer 412.

Figure 30:
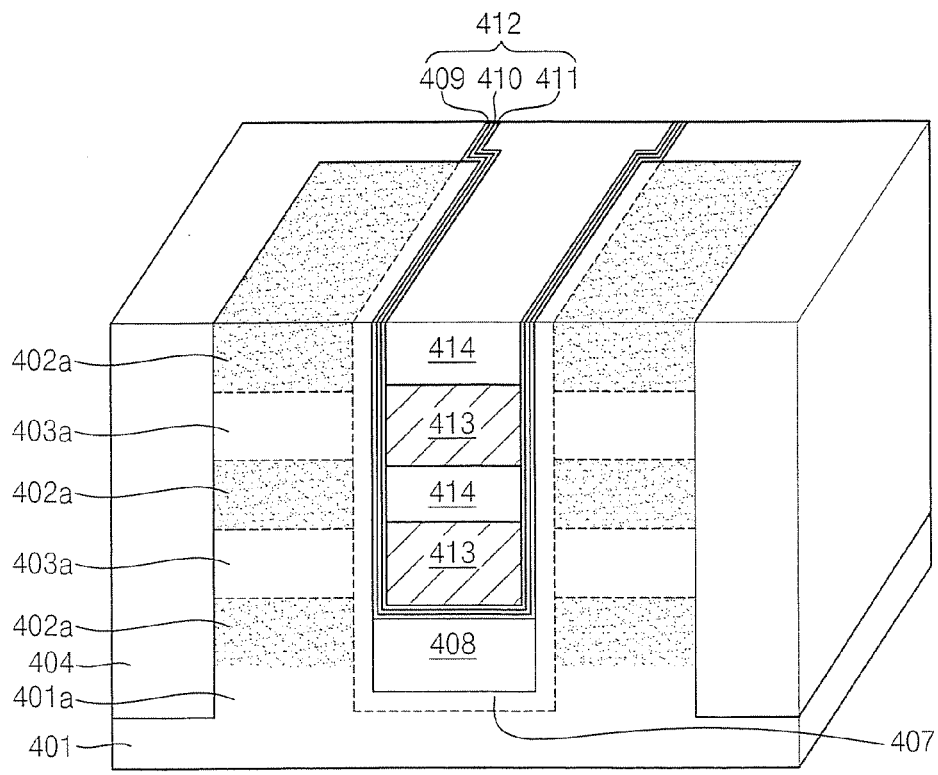
Figure 31:
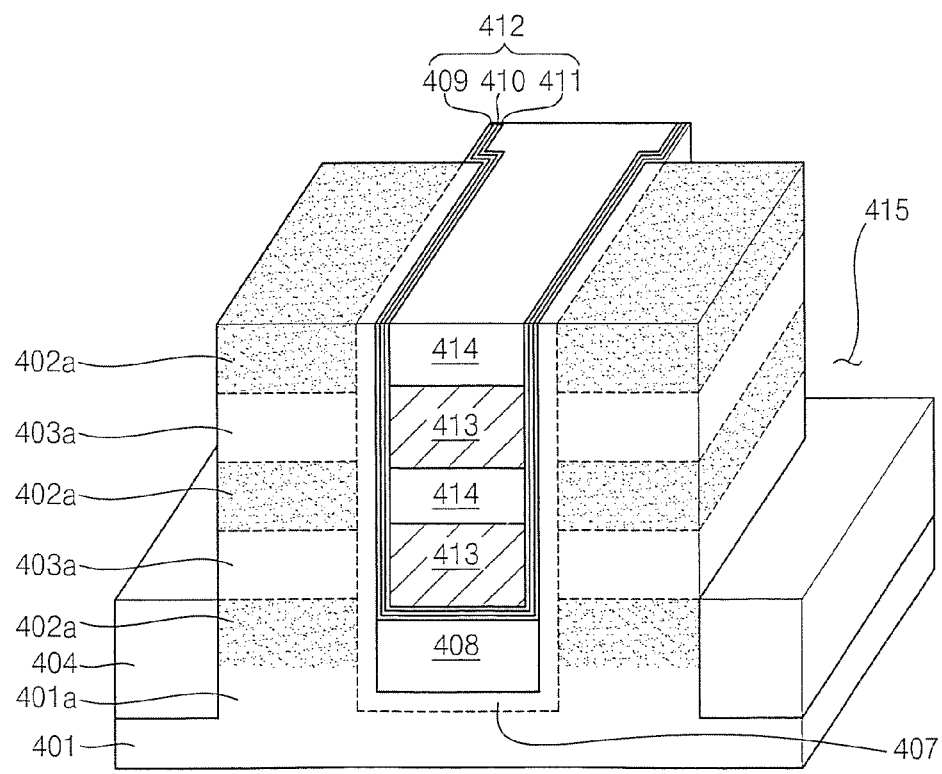
Figure 32:
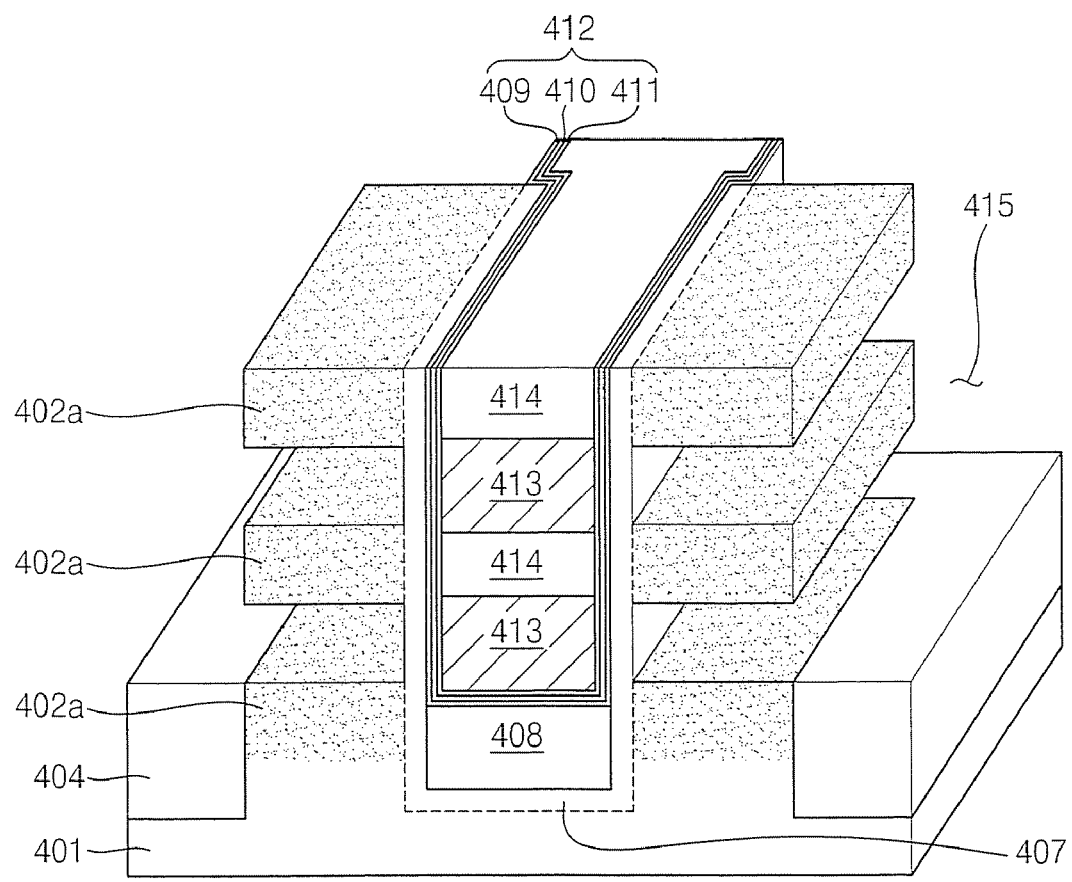
Figure 33:
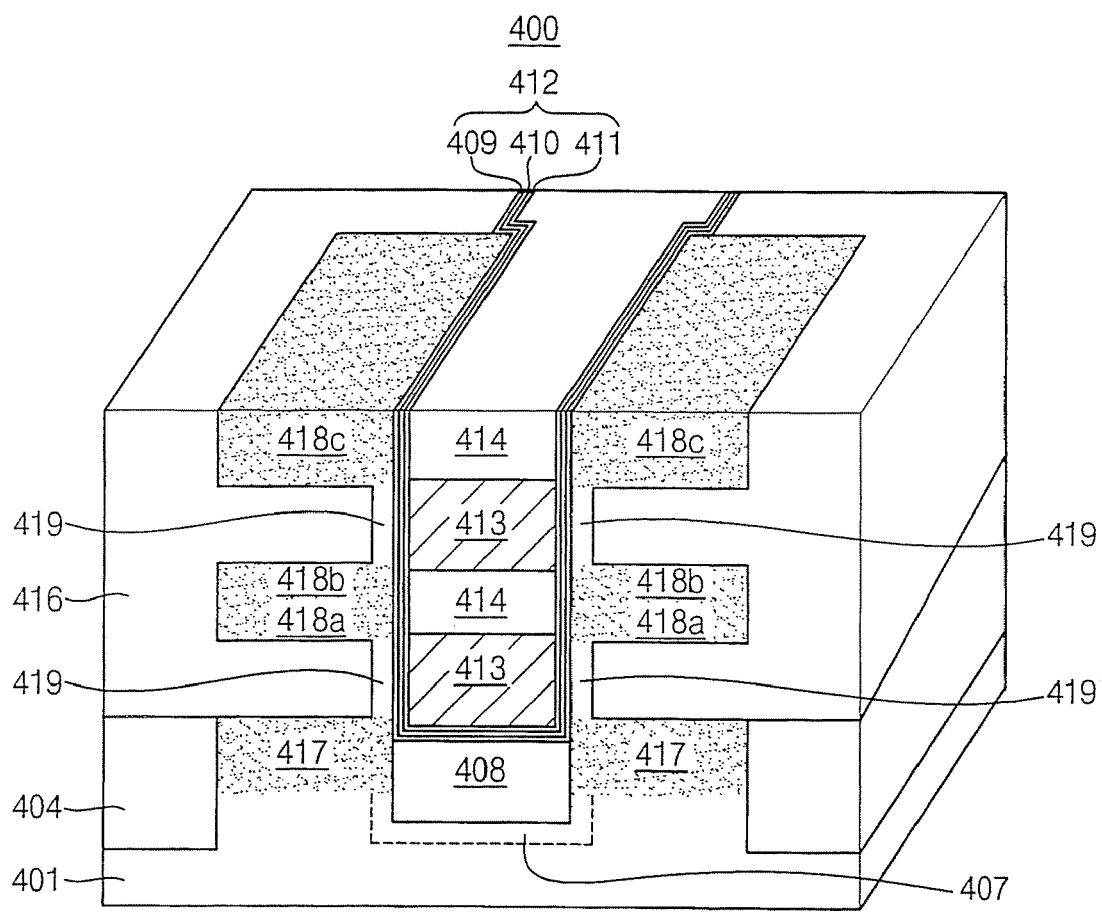

Referring to FIG. 30, the resultant structure is planarized to expose upper ones of the silicon patterns 402a. As shown in FIG. 31, portions of the STI region 401 are removed to expose the sacrificial patterns 403a. The sacrificial patterns 403a are etched away to form gaps that are filled with an insulation layer 416, as shown in FIGS. 32 and 33. The silicon patterns 402a and adjoining portions of the silicon layer 407 are ion implanted to form source/drain regions 417, 418a, 418b, 418c.

Figure 34:
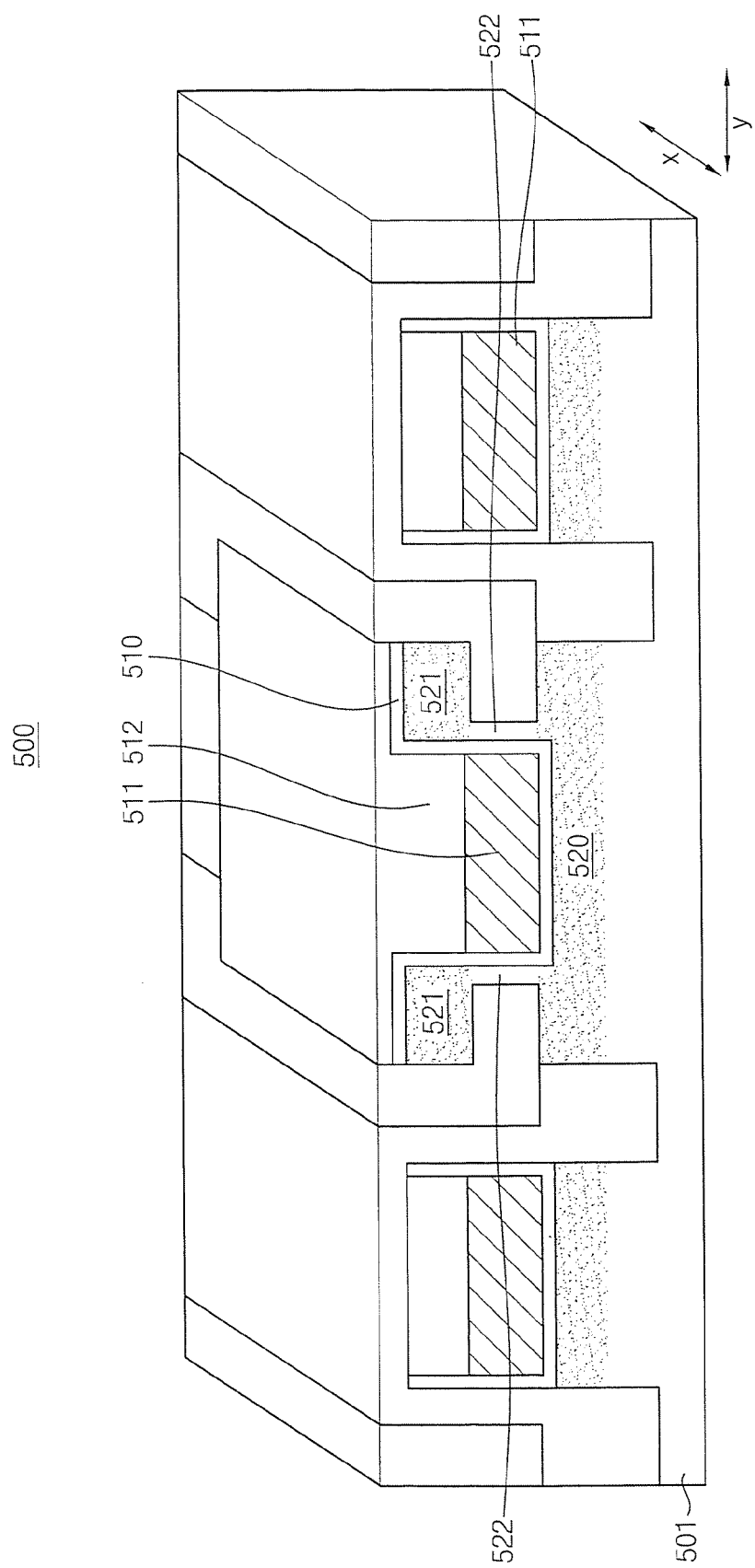
FIG. 34 illustrates a transistor for a transistor array according to some embodiments of the present invention.

FIG. 34 illustrates a transistor 500 according to further embodiments of the present invention. The transistor 500 has a vertical twin-channel structure including overlaid source/drain regions 520, 521 connected by vertical channels 522. A gate electrode is disposed on a gate insulator layer 510 between the source/drain regions 521. An insulation region 512 is disposed on the gate electrode 511.

The transistor 500 shown in FIG. 34 is configured for fabrication in a two-dimensionally arrayed arrangement. In particular, additional transistors (not shown) having the configuration of the transistor 500 are disposed along a y-axis. Along the y-axis, gate electrodes 511 are disposed on opposites sides of the transistor 500. These gate electrodes 511 are connected to additional transistors (not shown) that may have the same structure as the transistor 500 and that are displaced with respect to the transistor 500 along an x-axis that is perpendicular to the y-axis.

Figure 35:
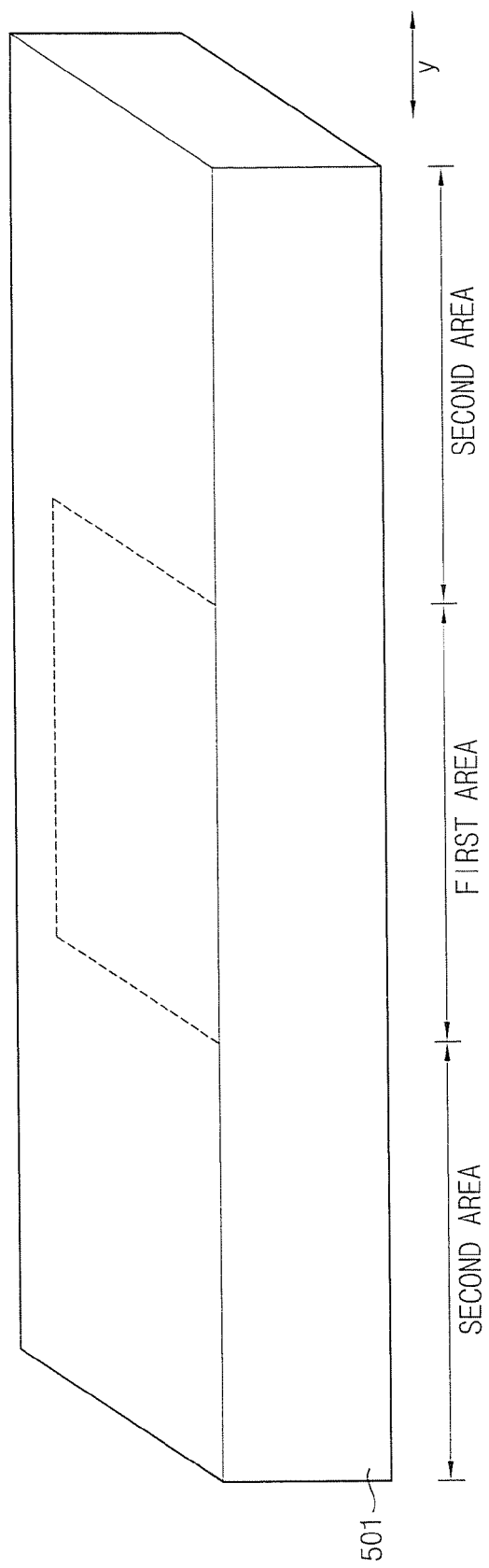
FIGS. 35-49 illustrate fabrication products and operations for forming the transistor of FIG. 34.
Figure 36:
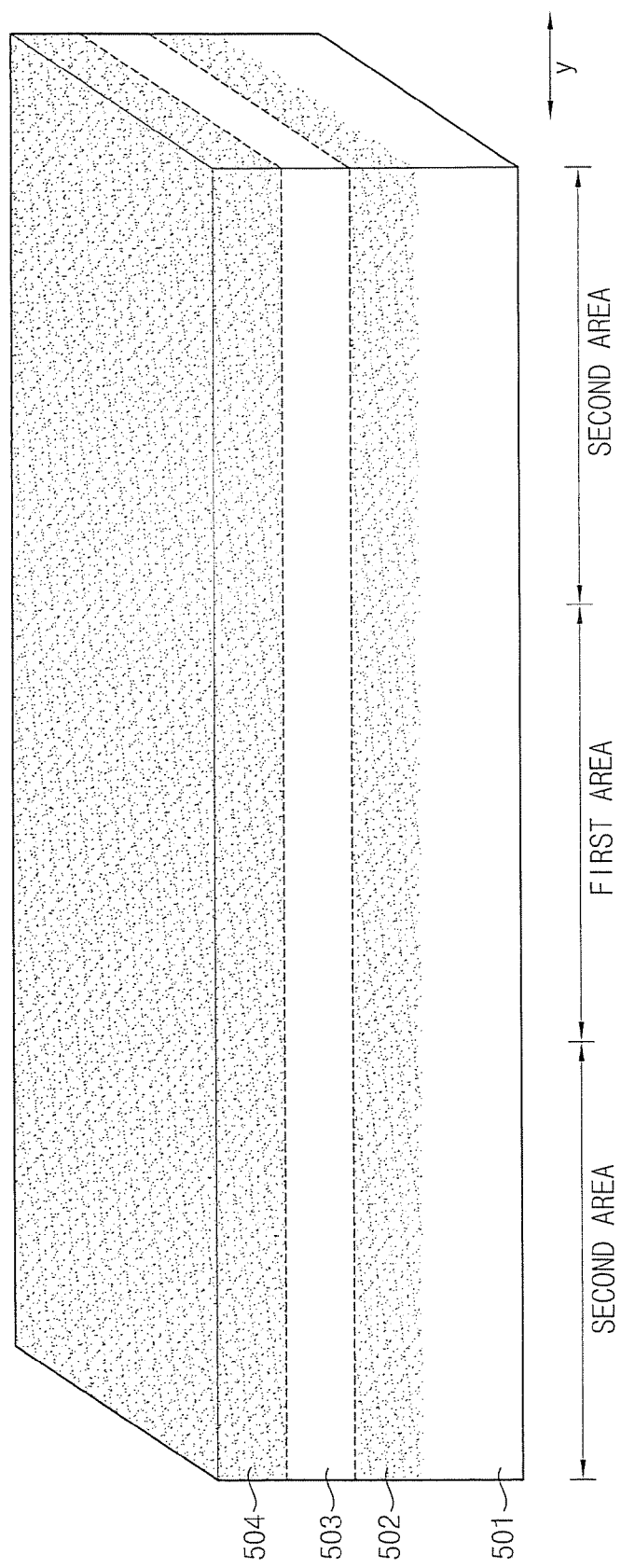
Figure 37:
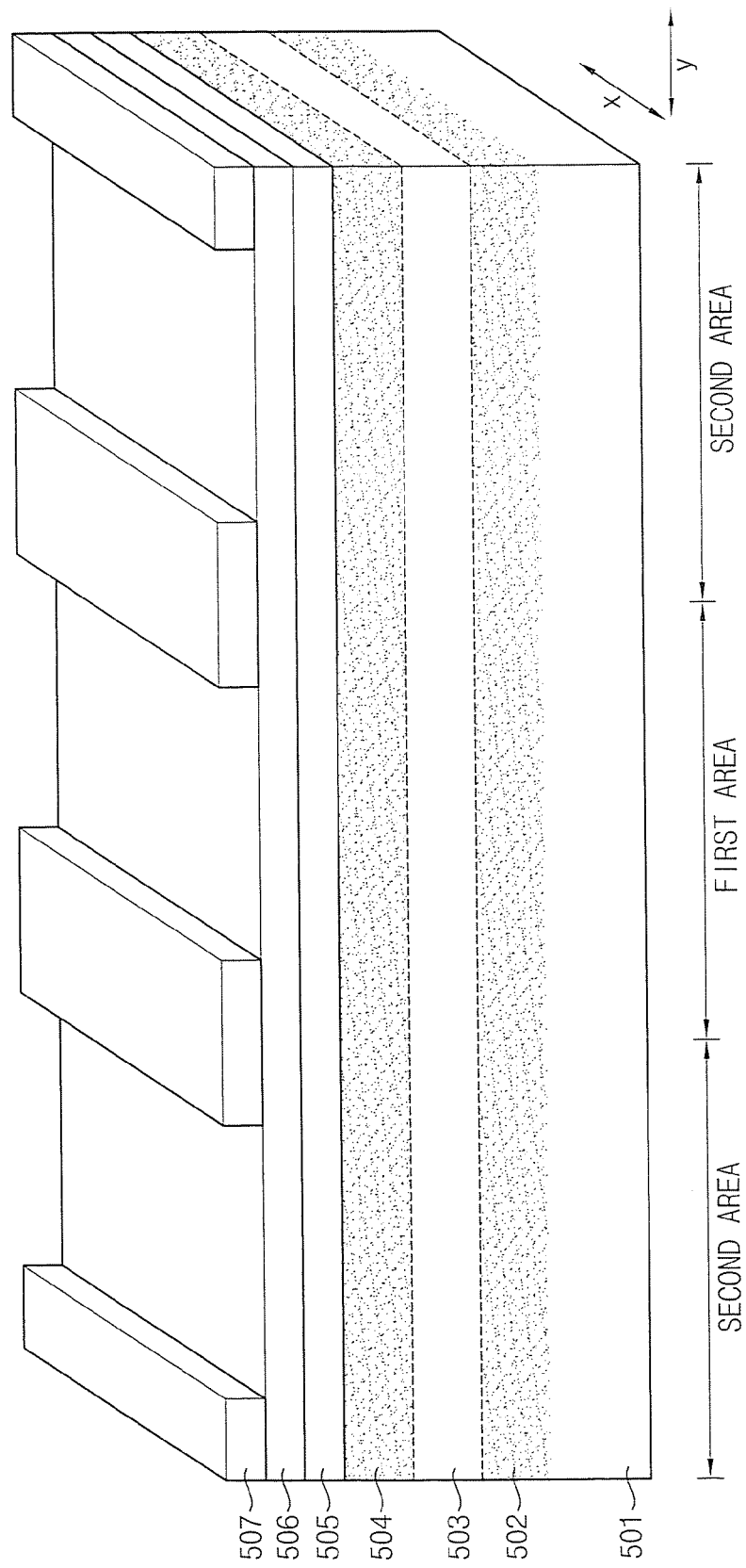
Figure 38:
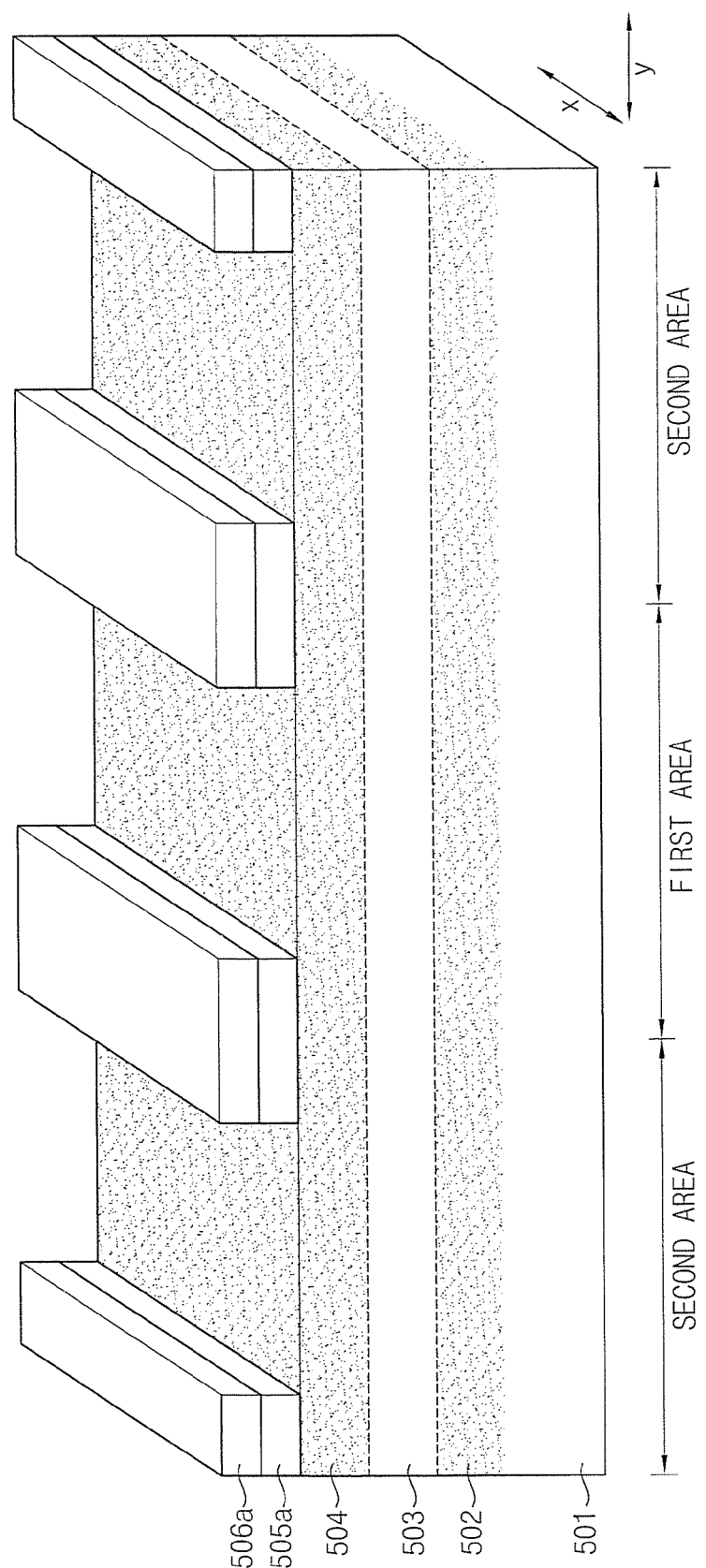
Figure 39:
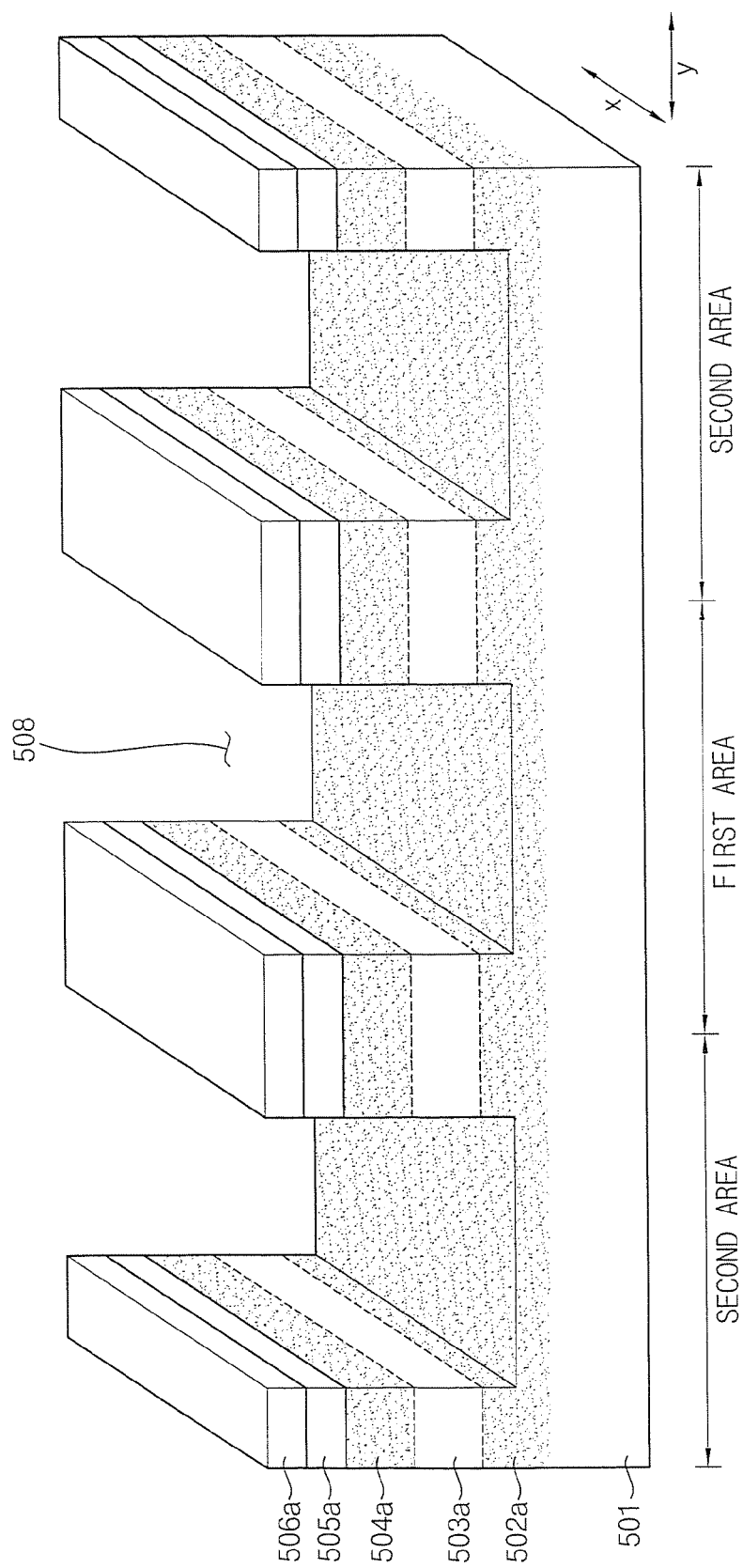

FIGS. 35-49 illustrate exemplary operations for fabricating the transistor 500 of FIG. 34. Referring to FIG. 35, first and second areas are defined on a substrate 501. As shown in FIG. 36, crystalline silicon layers 502, 504 and an intervening sacrificial layer 503 are formed on the substrate 501. As shown in FIG. 37, buffer and mask layers 505, 506 are formed on the upper silicon layer 504. Photomask patterns 507 are formed on the mask layer 506, exposing portions thereof in the first and second areas. Using the photomask patterns 507, mask patterns 506a and buffer patterns 505a are formed, as shown in FIG. 38. These patterns are used to etch trenches 508 through the silicon layers 502, 504 and the sacrificial layer 503, as shown in FIG. 39. The etching also forms stacks of silicon and sacrificial patterns 502a, 503a, 504a.

Figure 40:
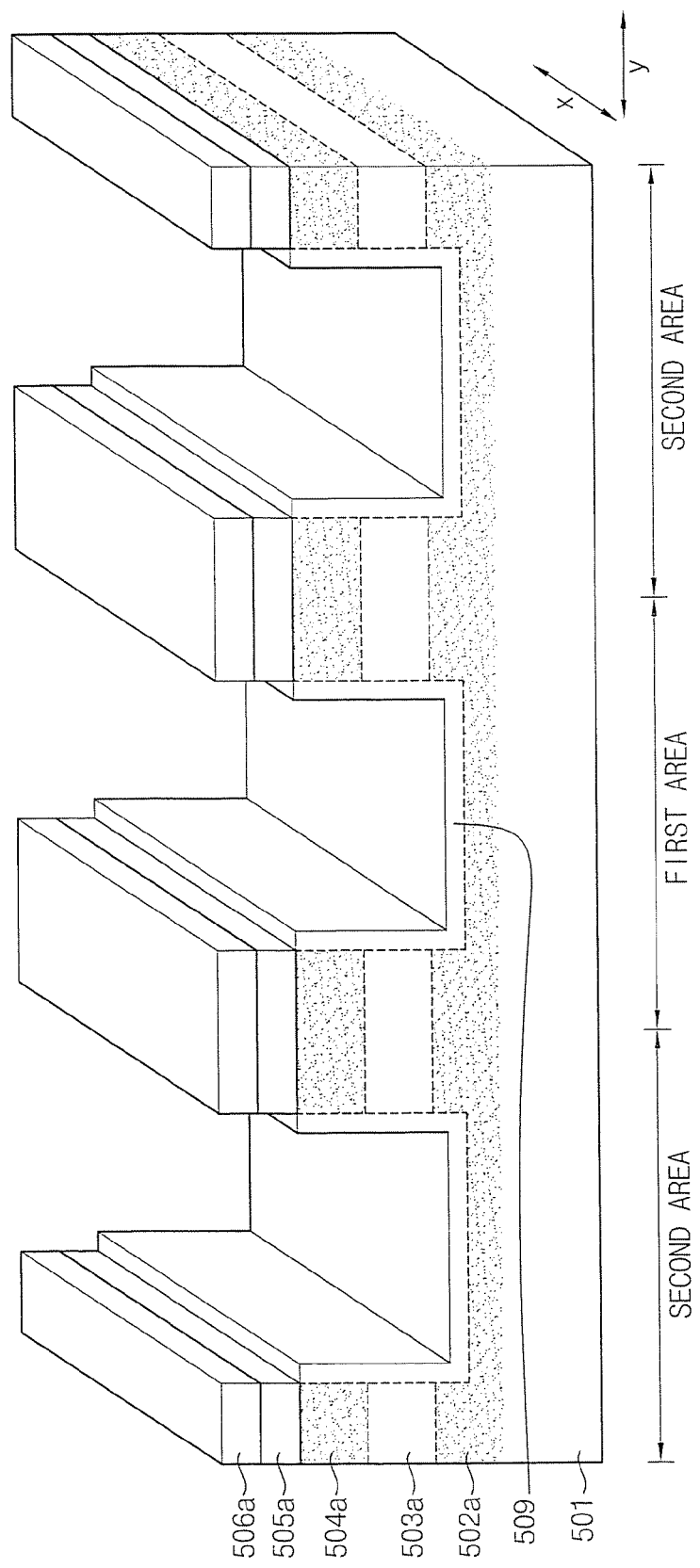
Figure 41:
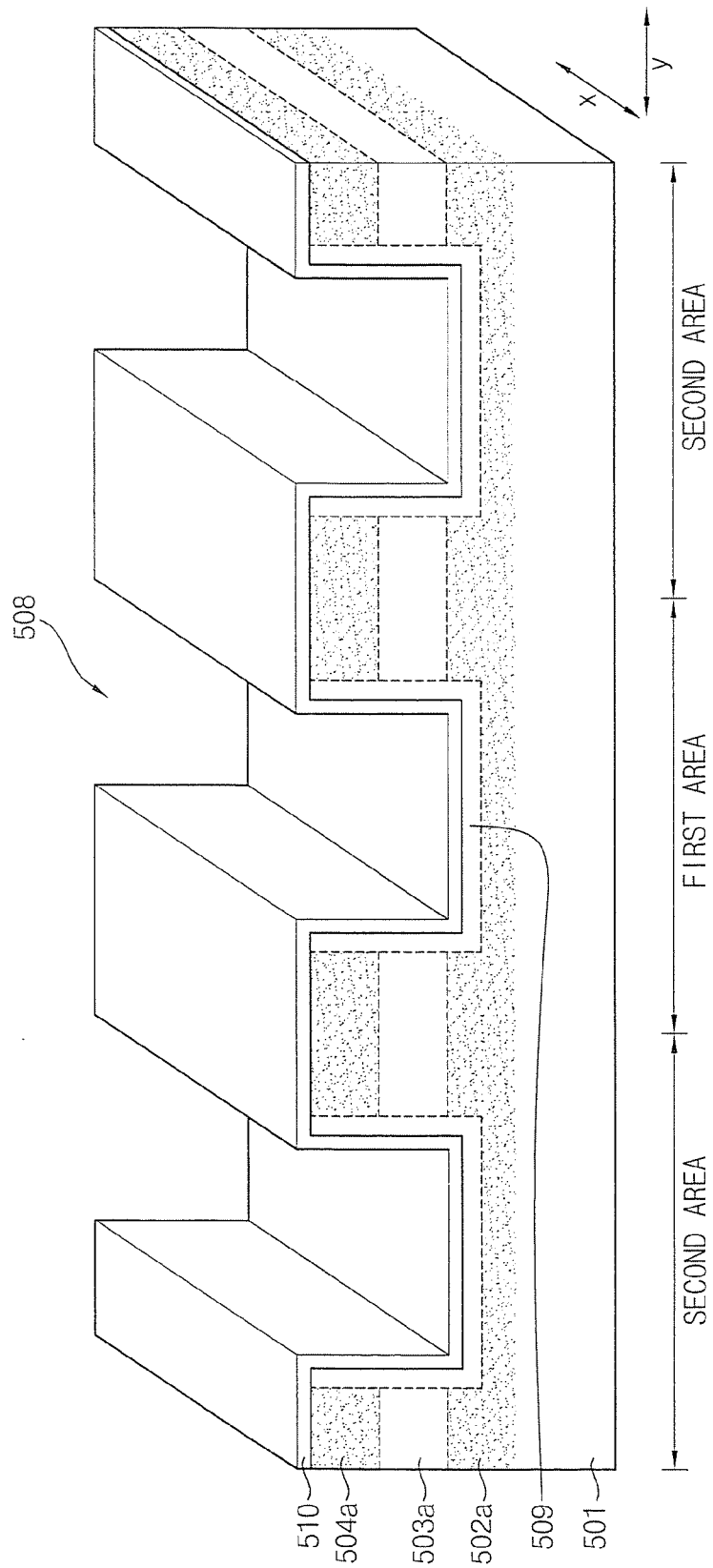
Figure 42:
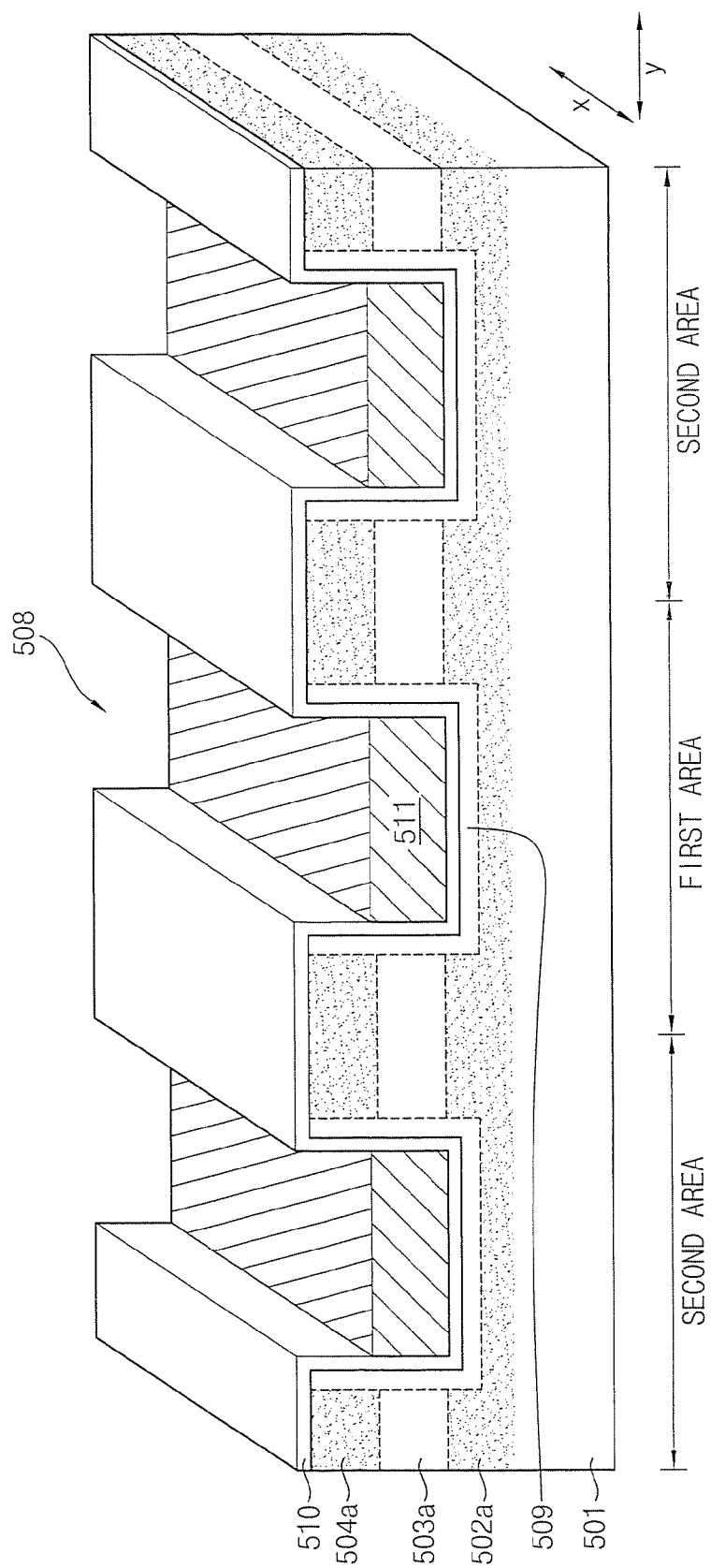

Referring to FIG. 40, a crystalline silicon layer 509 is formed on bottom and sidewall surfaces of the trenches 508. As shown in FIG. 41, the buffer and mask patterns 505a, 506a are removed and a gate insulation layer 510 is formed on the resultant structure, covering the crystalline silicon layer 509 and the adjacent patterns 502a, 503a, 504a. Gate electrodes 511 are then formed one the gate insulation layer 510 in the trenches 508, as shown in FIG. 42.

Figure 43:
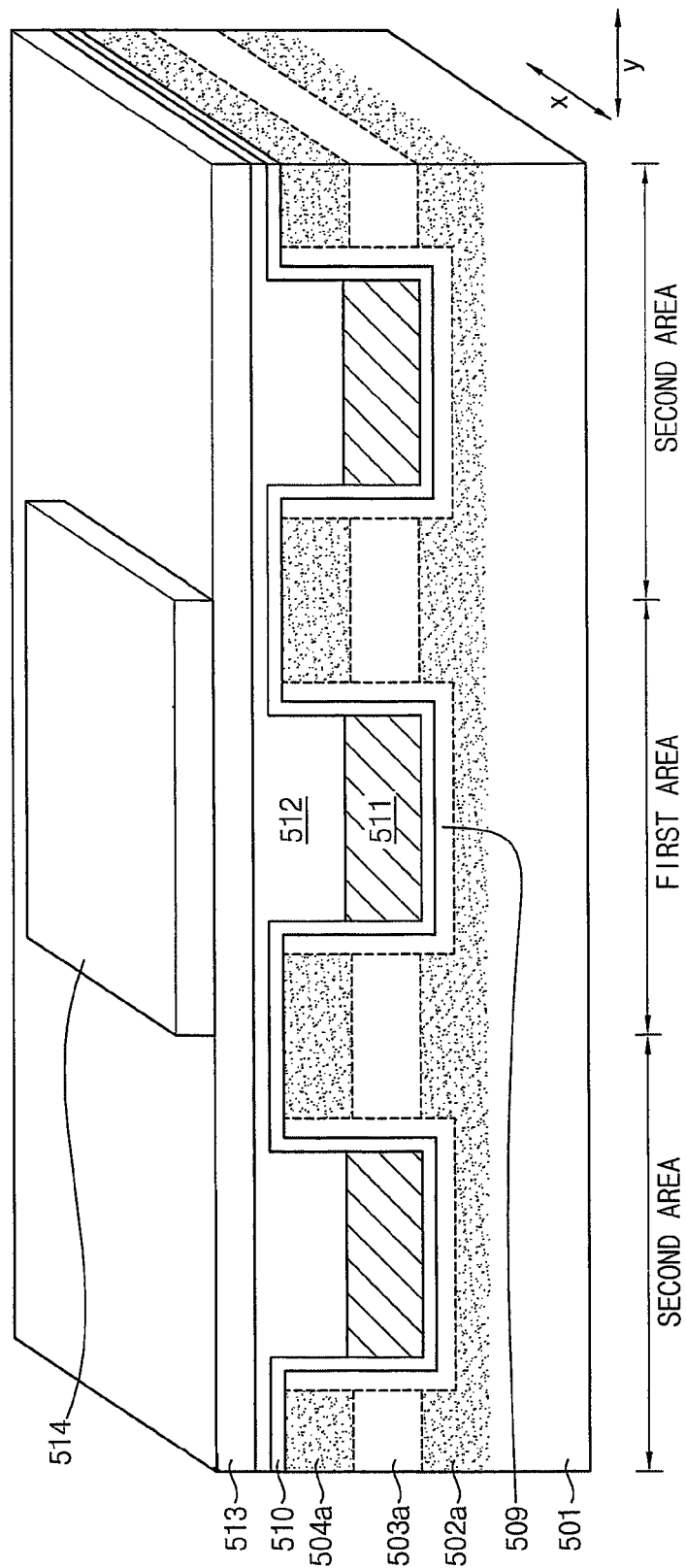
Figure 44:
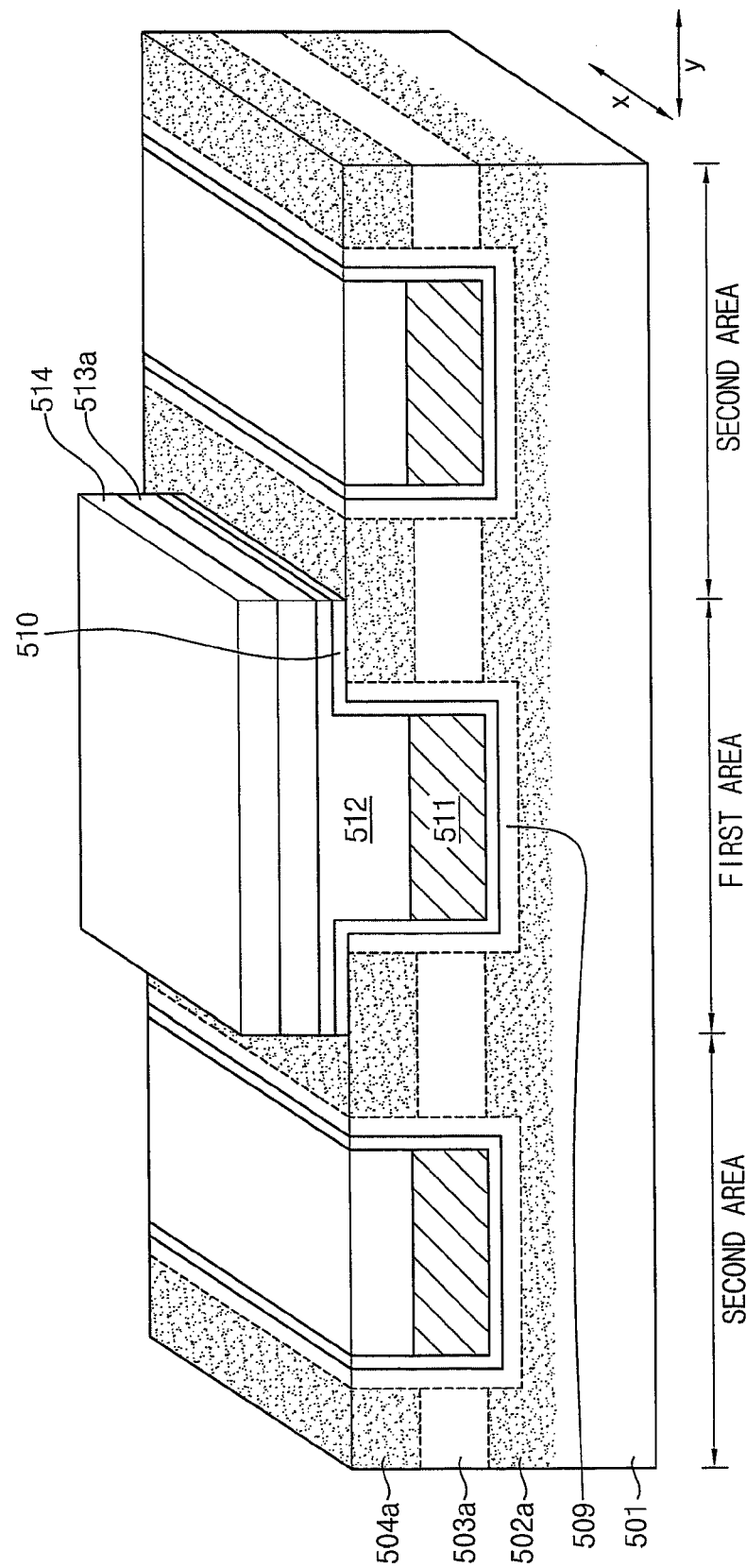

Referring to FIG. 43, an insulating layer 512 is formed on the gate electrodes 511, followed by a formation of a mask layer 513 on the insulating layer 512. A photomask 514 is formed on the mask layer 513 in the first area, and used as an etching mask to remove portions of the mask layer 513 and the insulating layer 512 in the second areas and leave a mask pattern 513a, as shown in FIG. 44.

Figure 45:
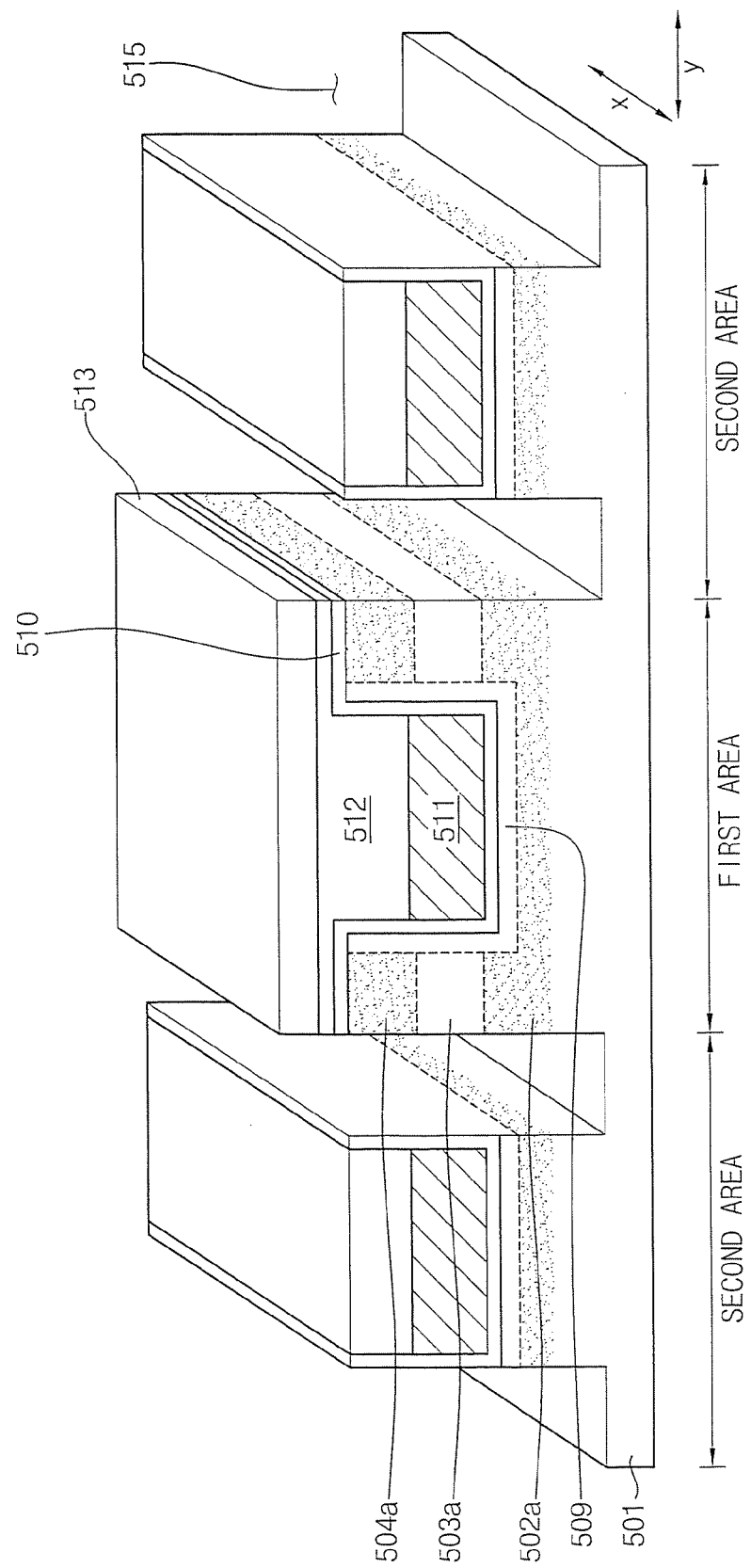
Figure 46:
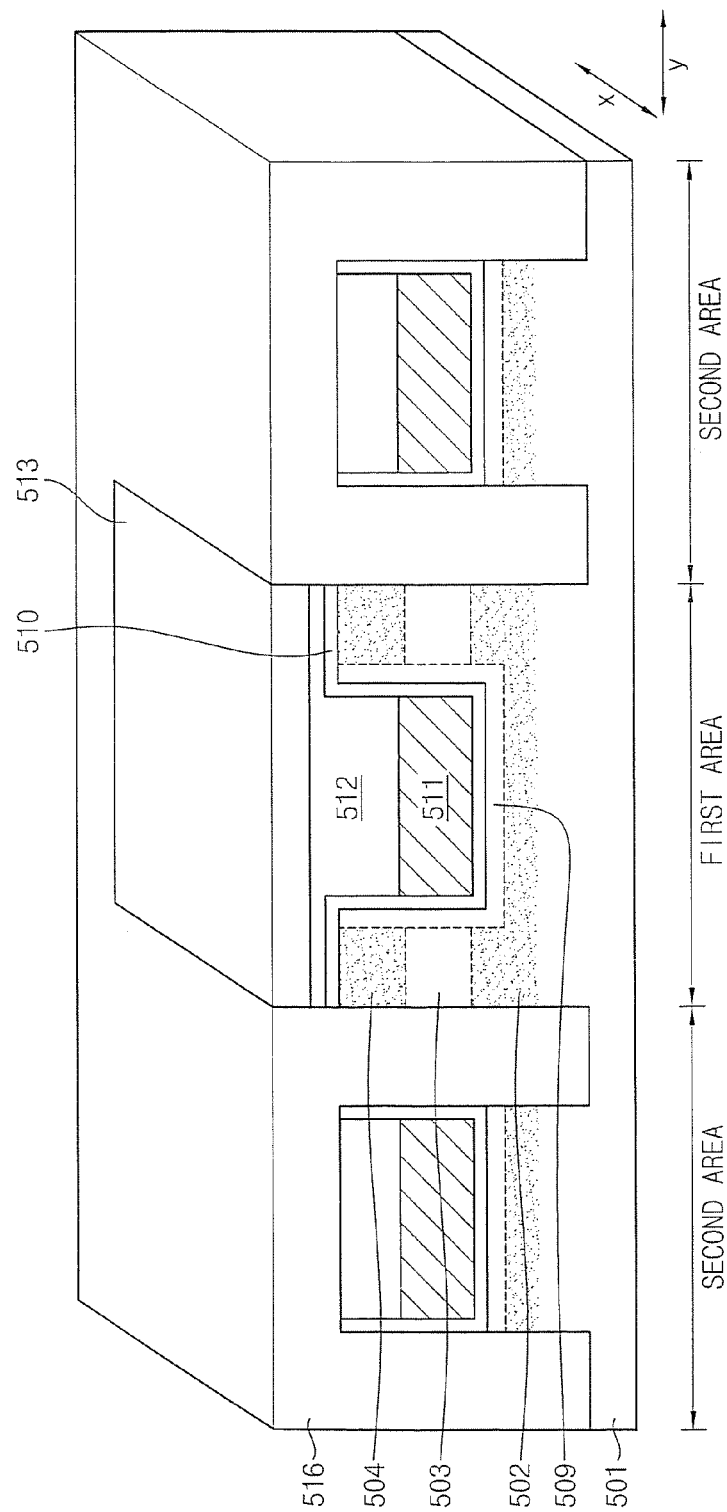
Figure 47:
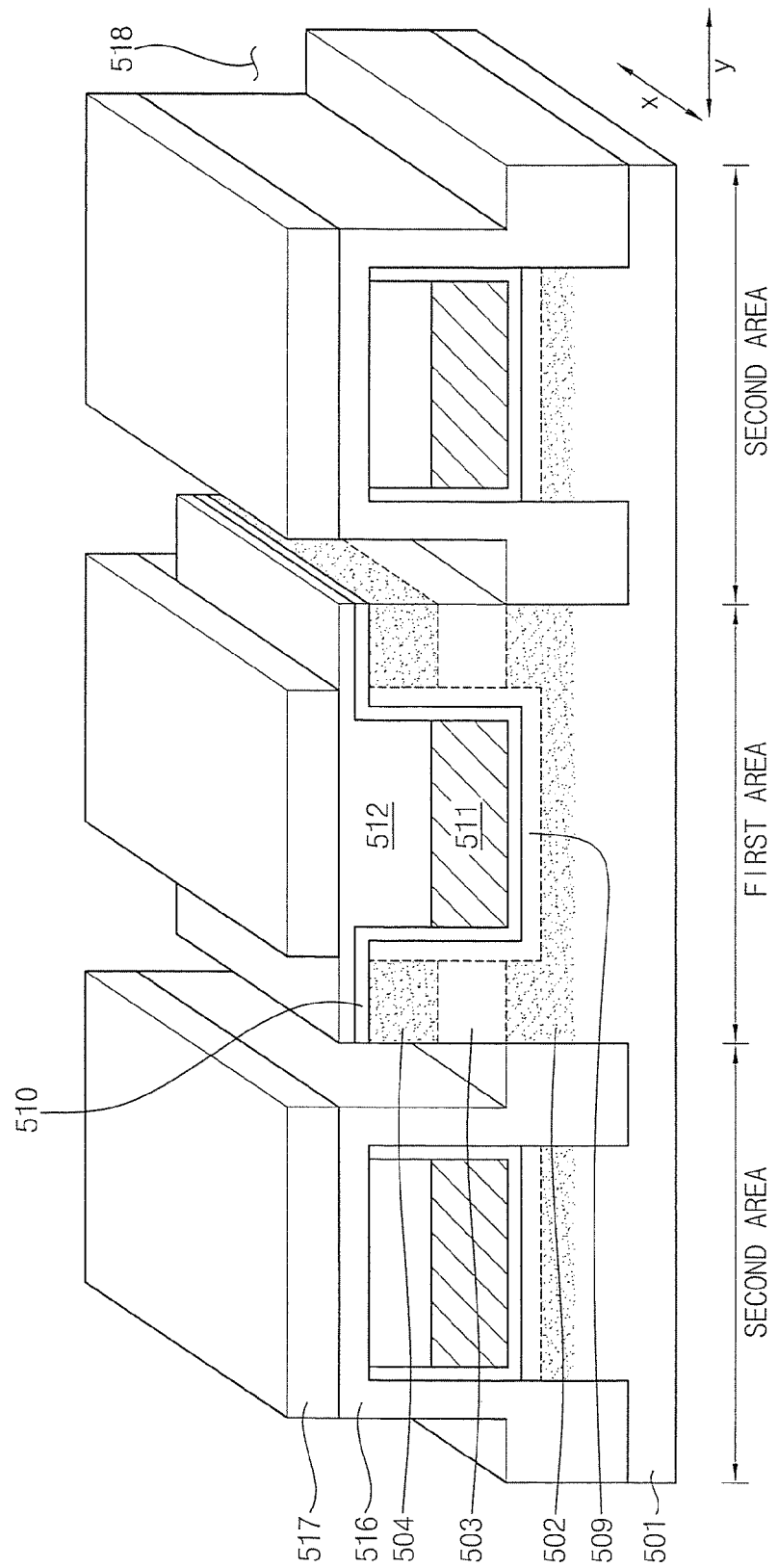
Figure 48:
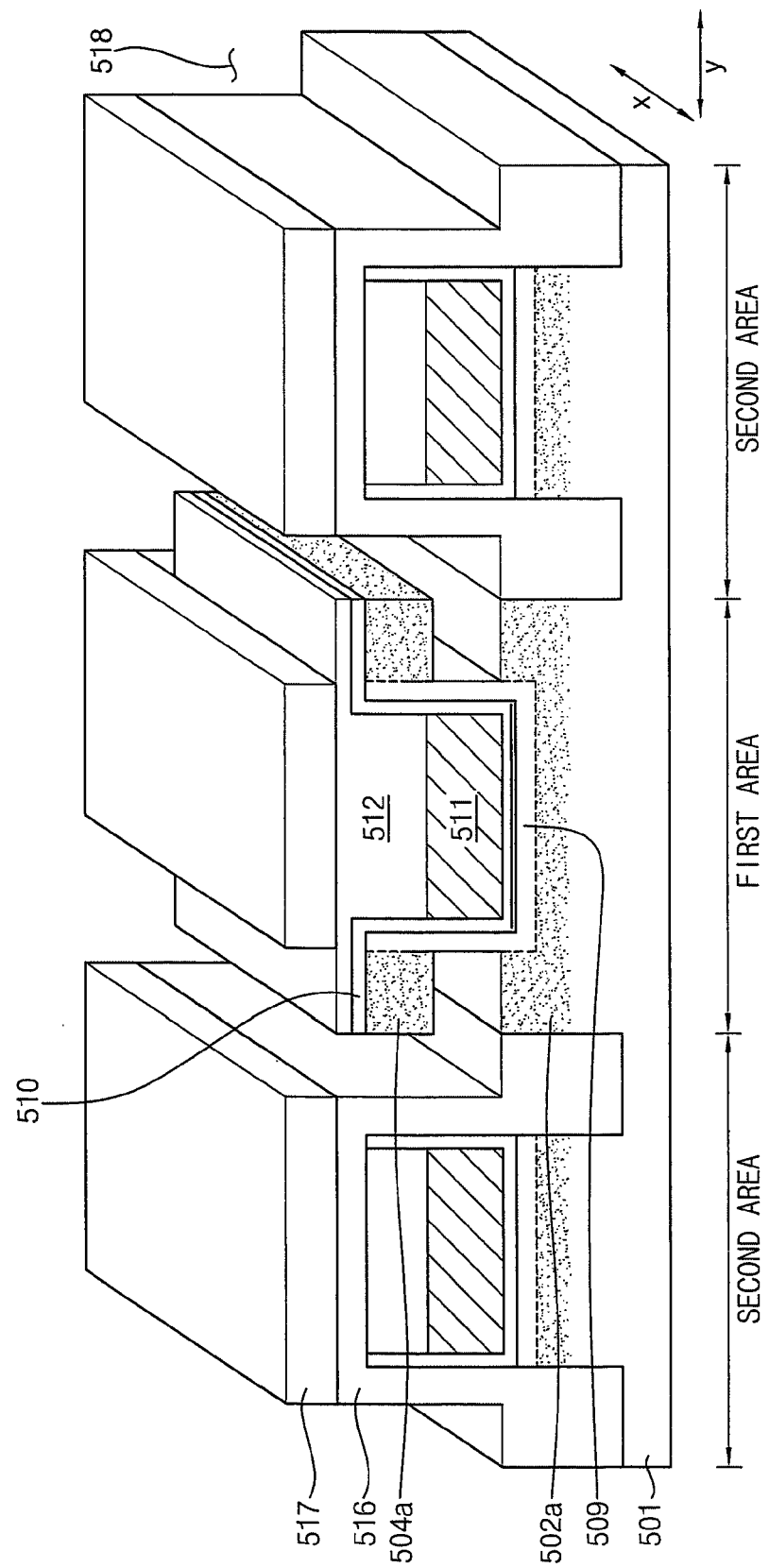
Figure 49:
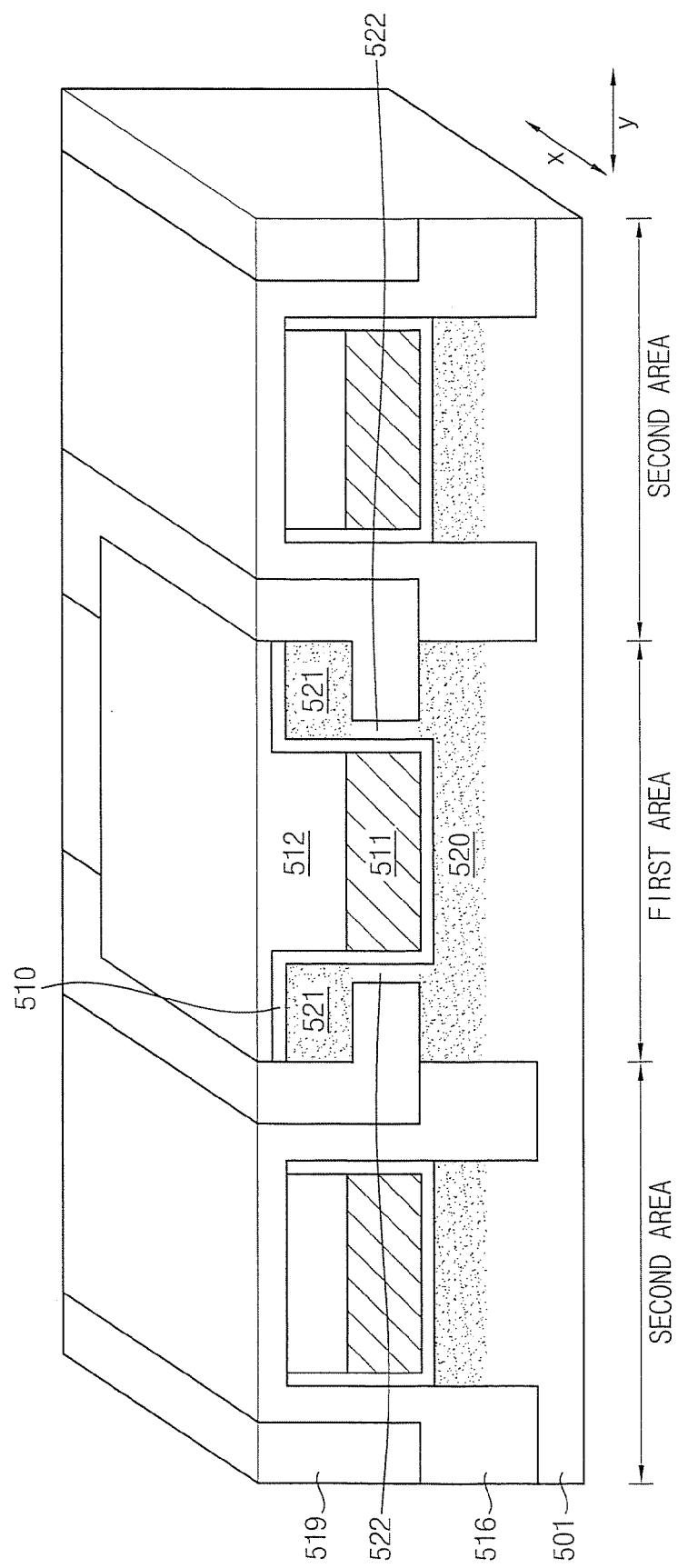

Referring to FIG. 45, the mask pattern 513a is used as an etching mask to remove silicon and sacrificial patterns 502a-504a outside of the mask pattern 513a, and form trenches 515 that expose sidewalls of silicon and sacrificial patterns 502a-504a underlying the mask pattern 513a. The trenches 515 are filled with an insulating layer 516, which is planarized to produce the structure shown in FIG. 46. Mask patterns 517 are then formed and used to formed trenches 518, as shown in FIG. 47. Referring to FIGS. 48 and 49, sacrificial patterns 503 exposed by the trenches 518 are then removed and the resulting gaps filled with an insulation layer 519. Silicon patterns 502a, 504a and adjoining portions of the silicon layer 509 are ion implanted to form source/drain regions 520, 521, which are connected by vertical channels 522.

Figure 50:
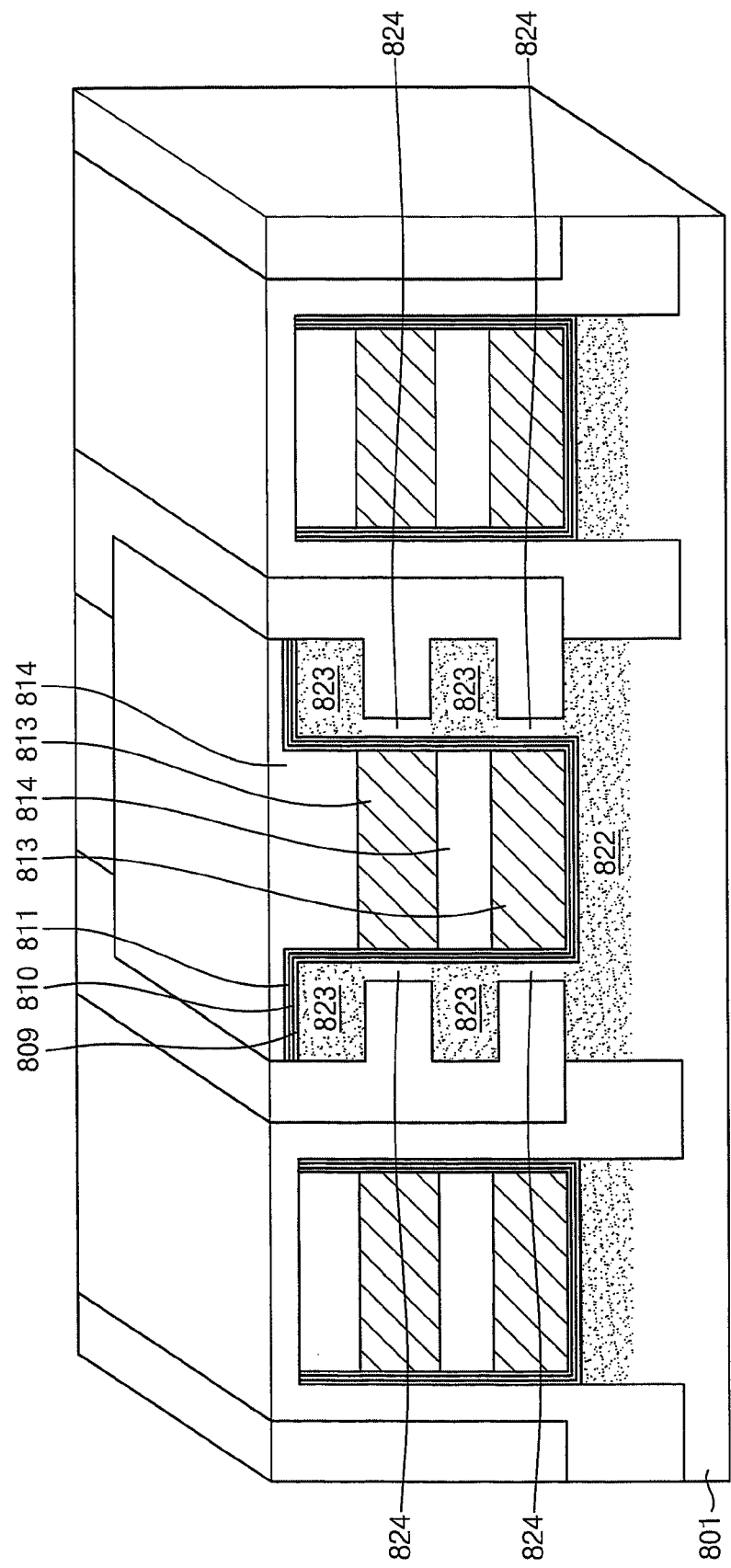
FIG. 50 illustrates a transistor for a transistor array according to some embodiments of the present invention.

FIG. 50 illustrates an array transistor 800 according to yet additional embodiments of the present invention. The transistor 800 includes a stack of overlaid source/drain regions 822, 832 connected by vertical channel regions 824 on a substrate 801. First and second gate electrodes 813 are disposed between respective pairs of the channel regions 824 and separated therefrom by a gate insulator layer including oxide layers 809, 811 and an intervening nitride layer 810. A first insulation region 814 is disposed between the gate electrodes 813, and a second insulation region 814 is disposed on a top one of the gate electrodes 813.

Figure 51:
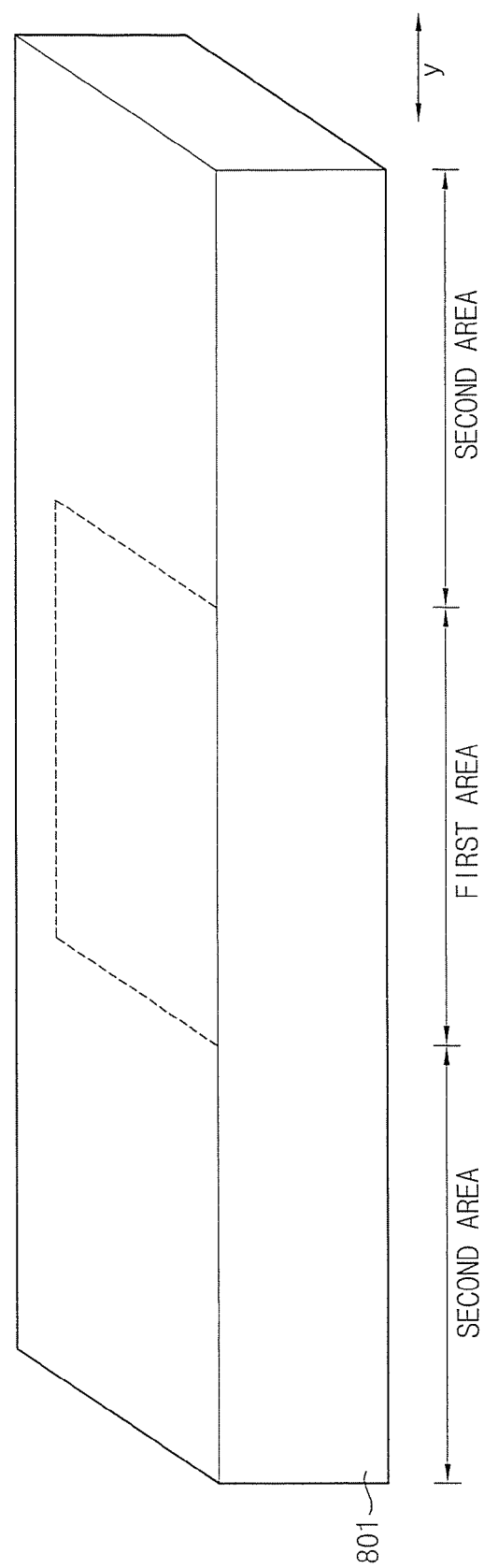
FIGS. 51-60 illustrate fabrication products and operations for forming the transistor of FIG. 50.
Figure 52:
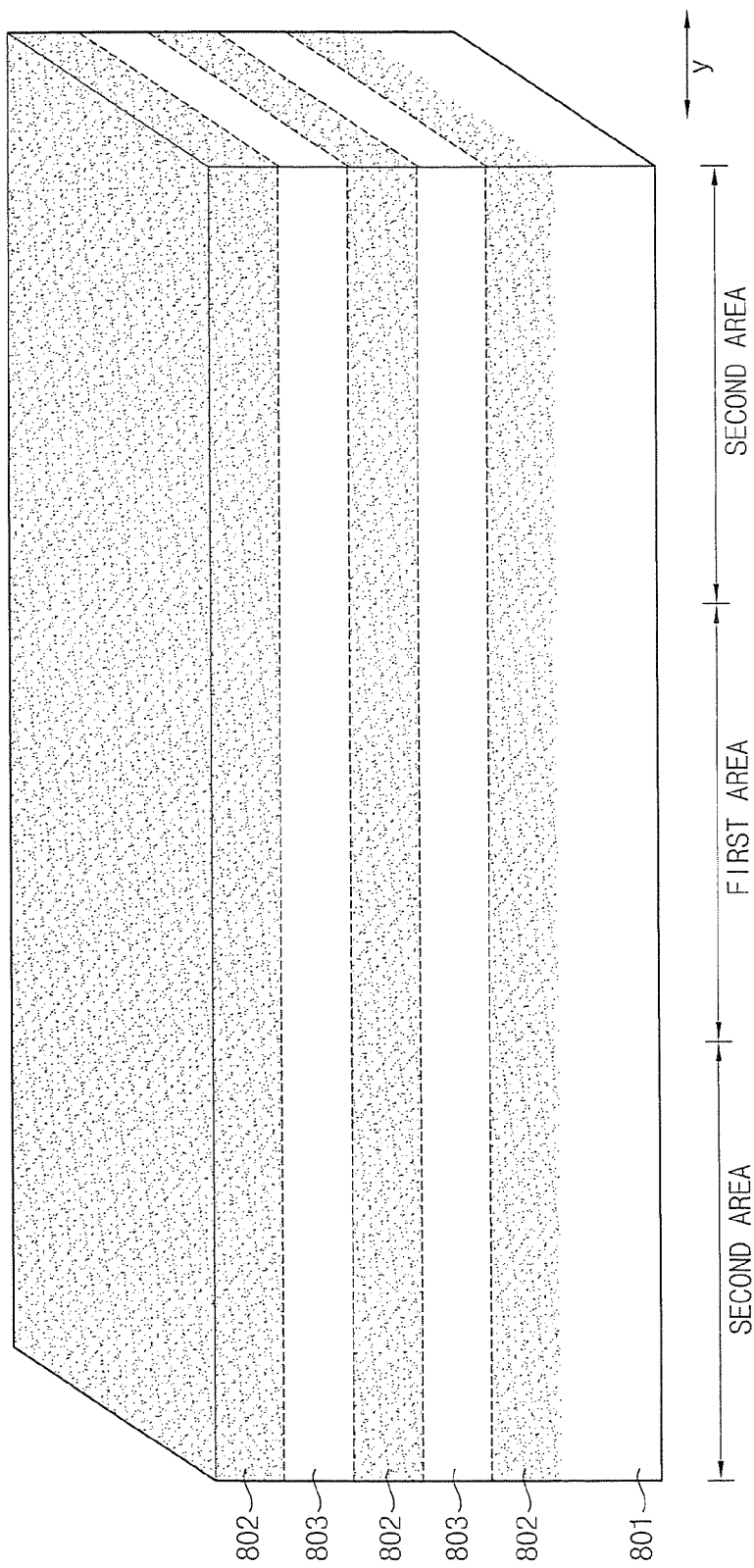
Figure 53:
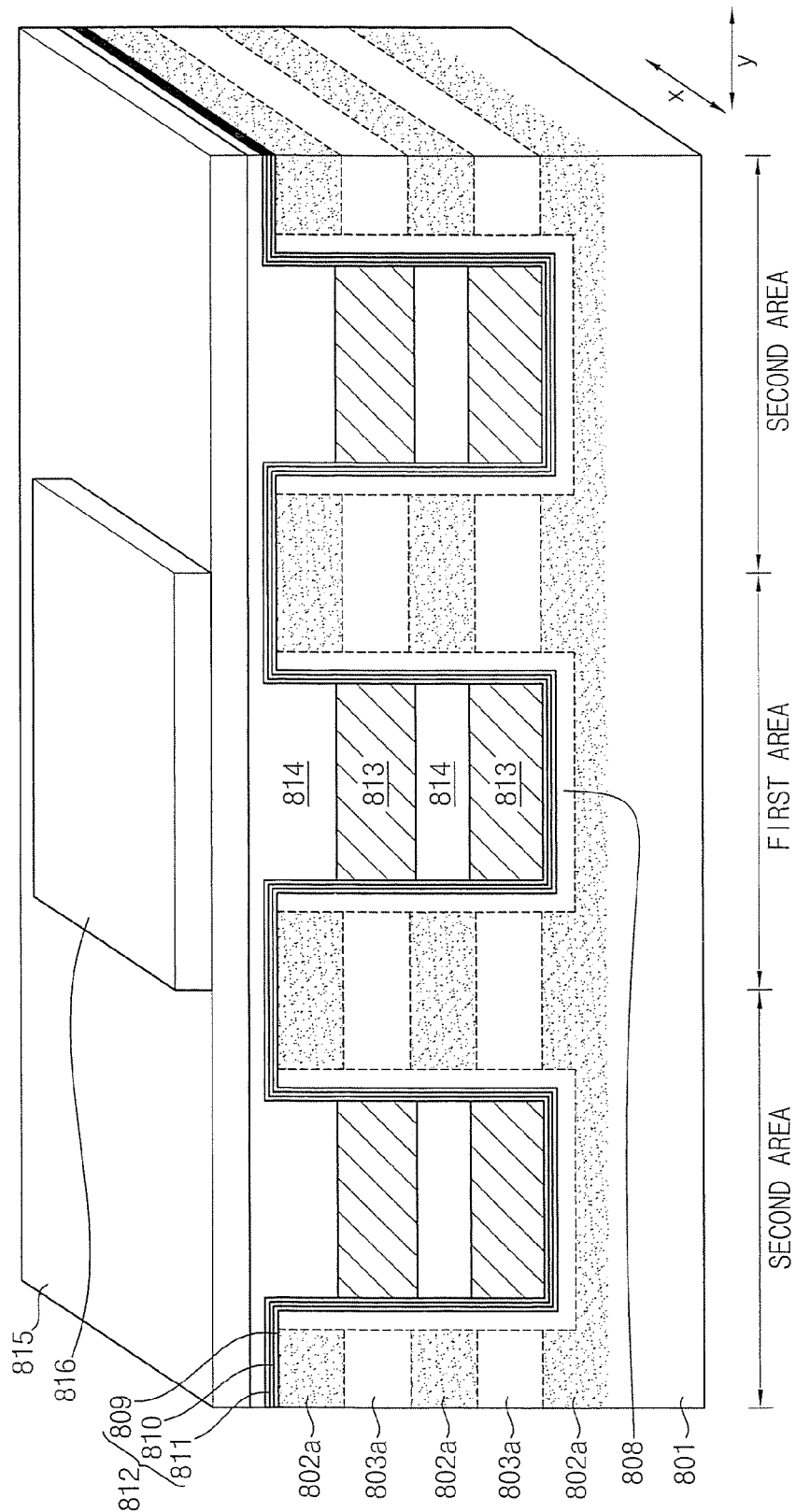
Figure 54:
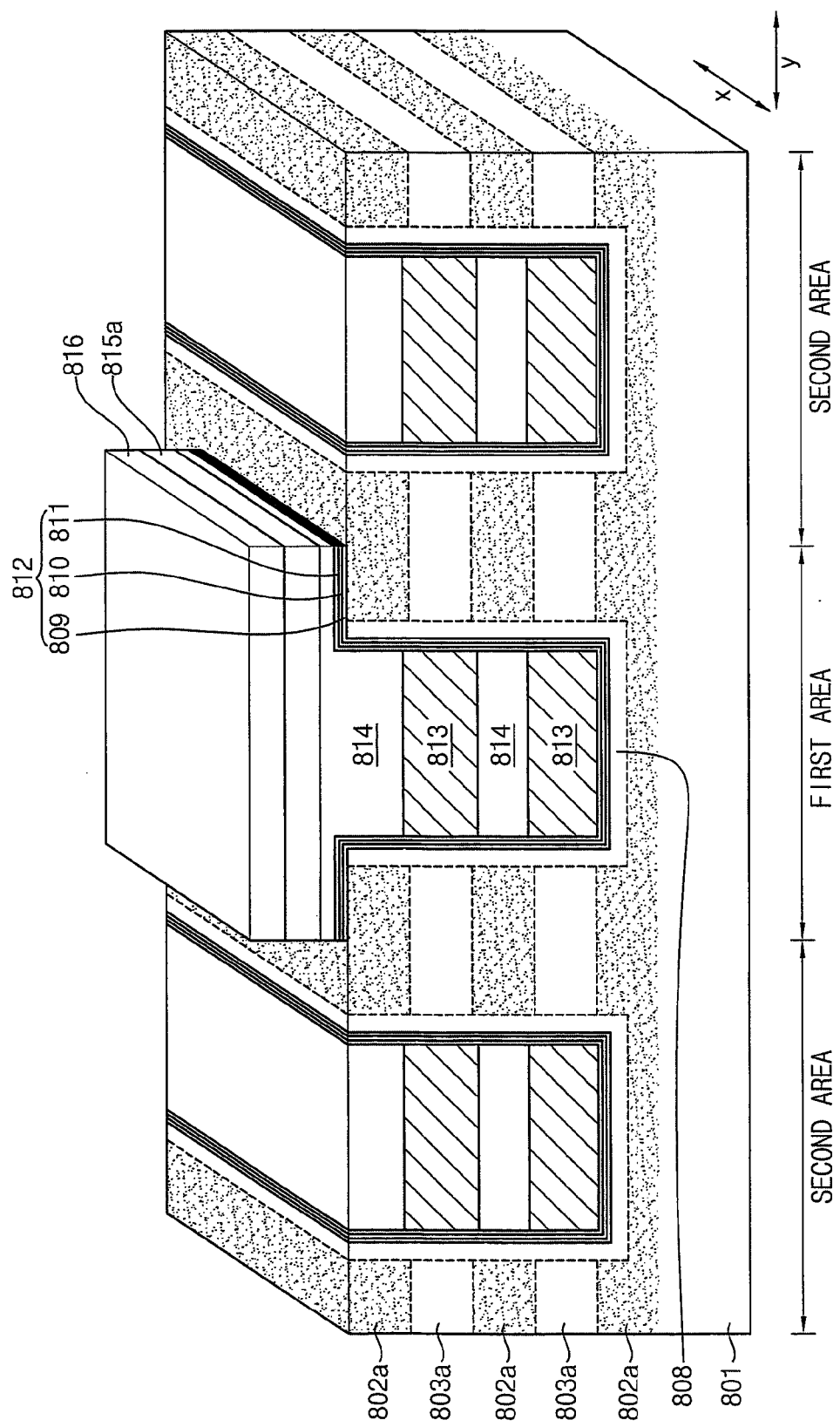
Figure 55:
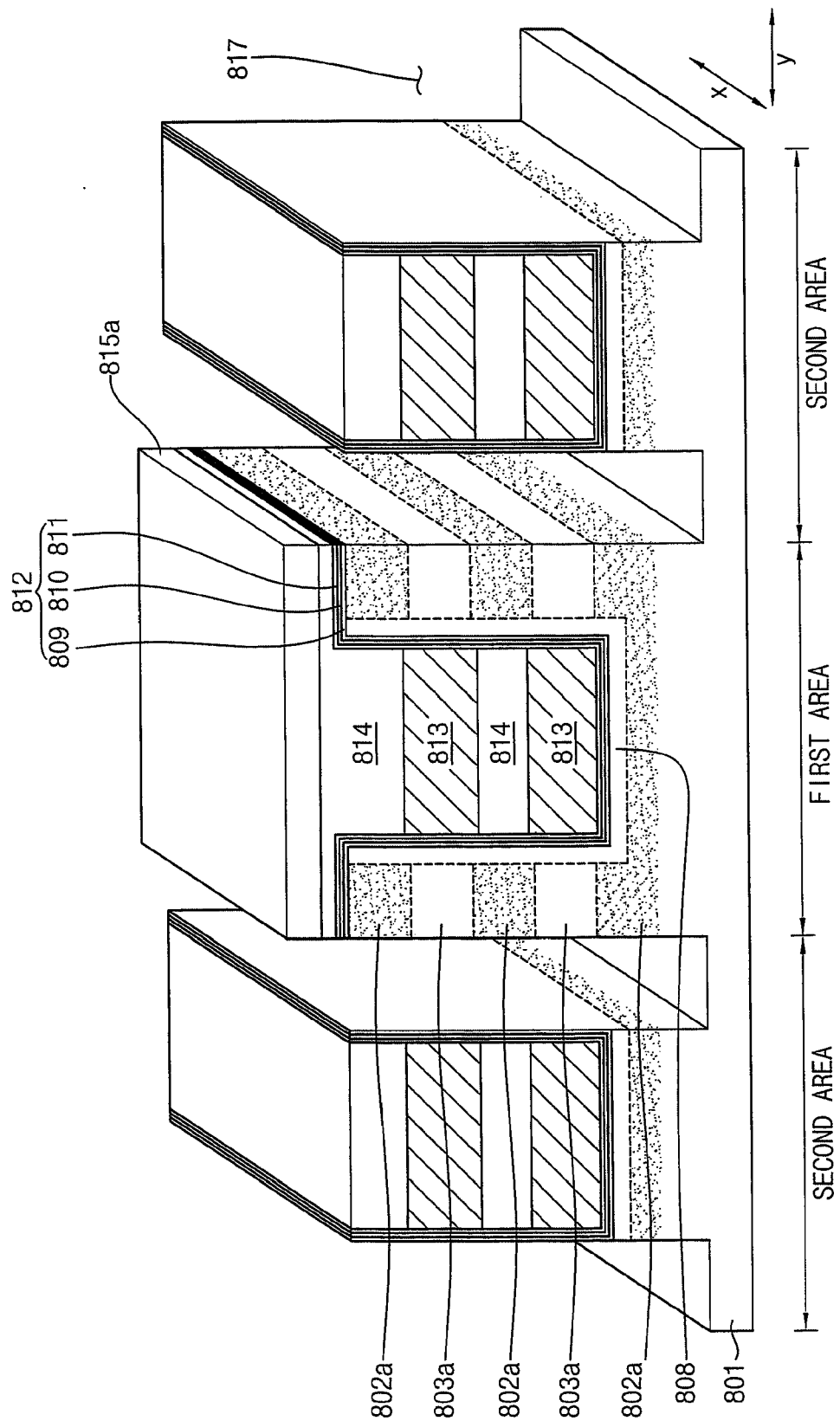
Figure 56:
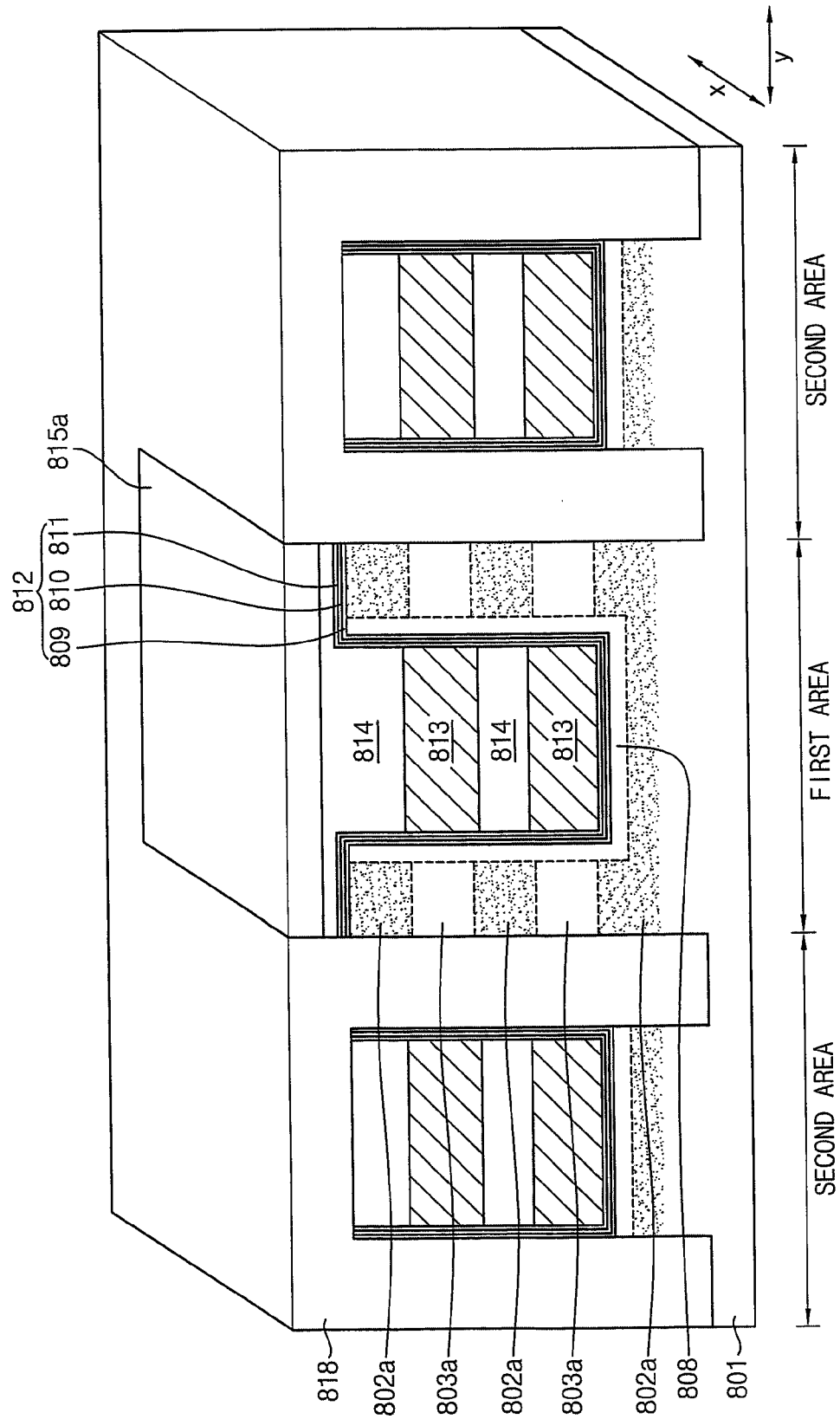
Figure 57:
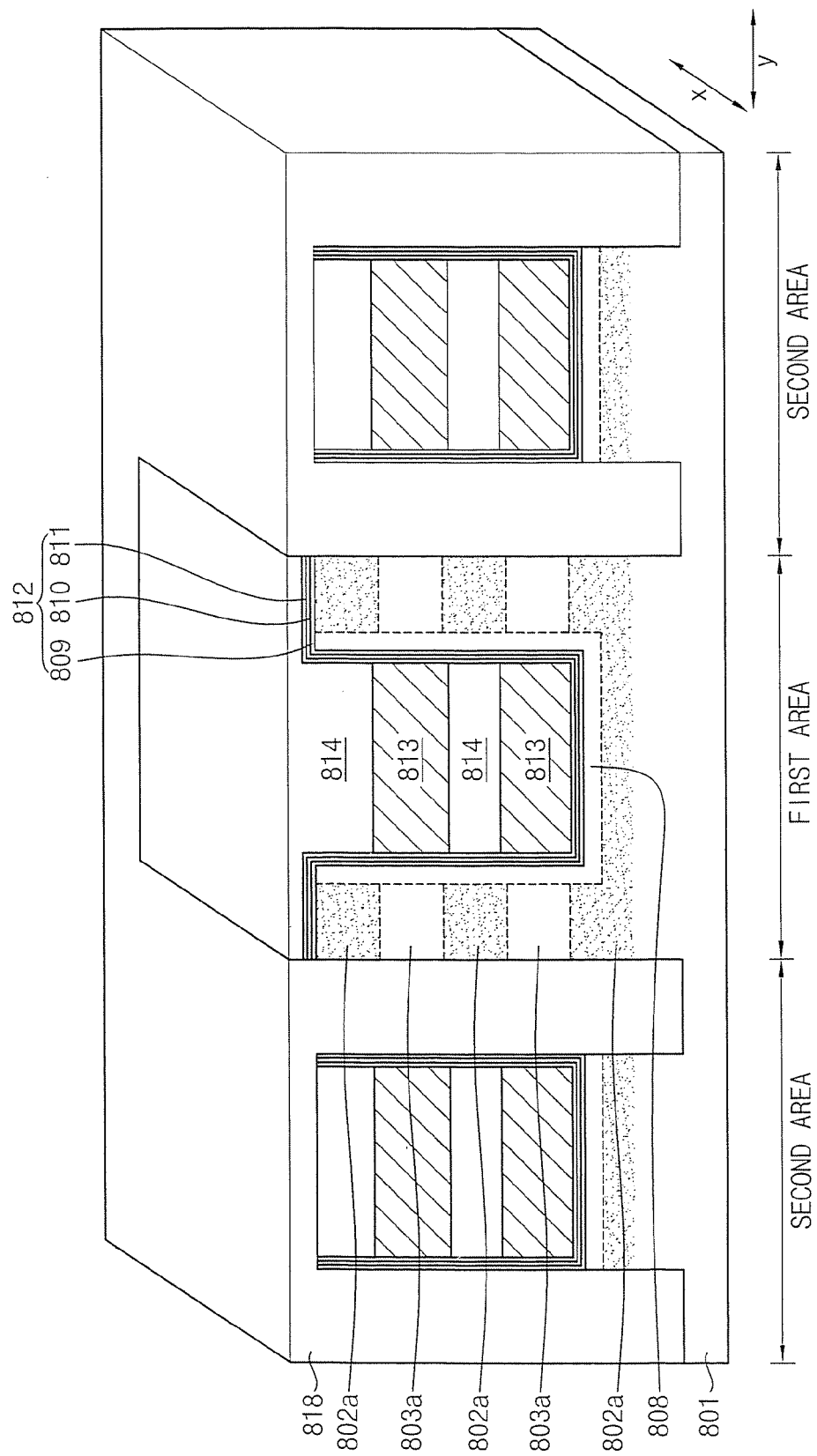
Figure 58:
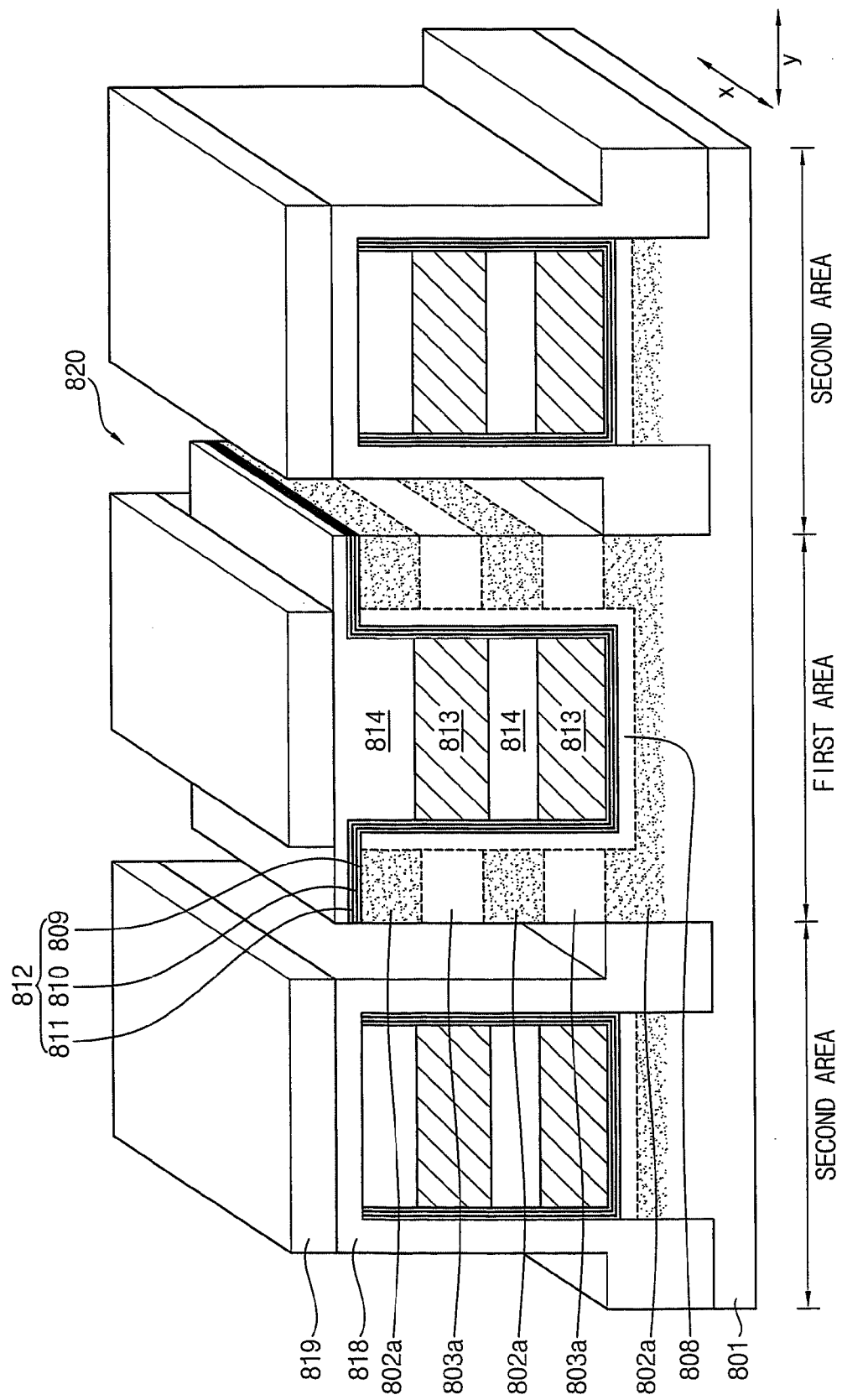
Figure 59:
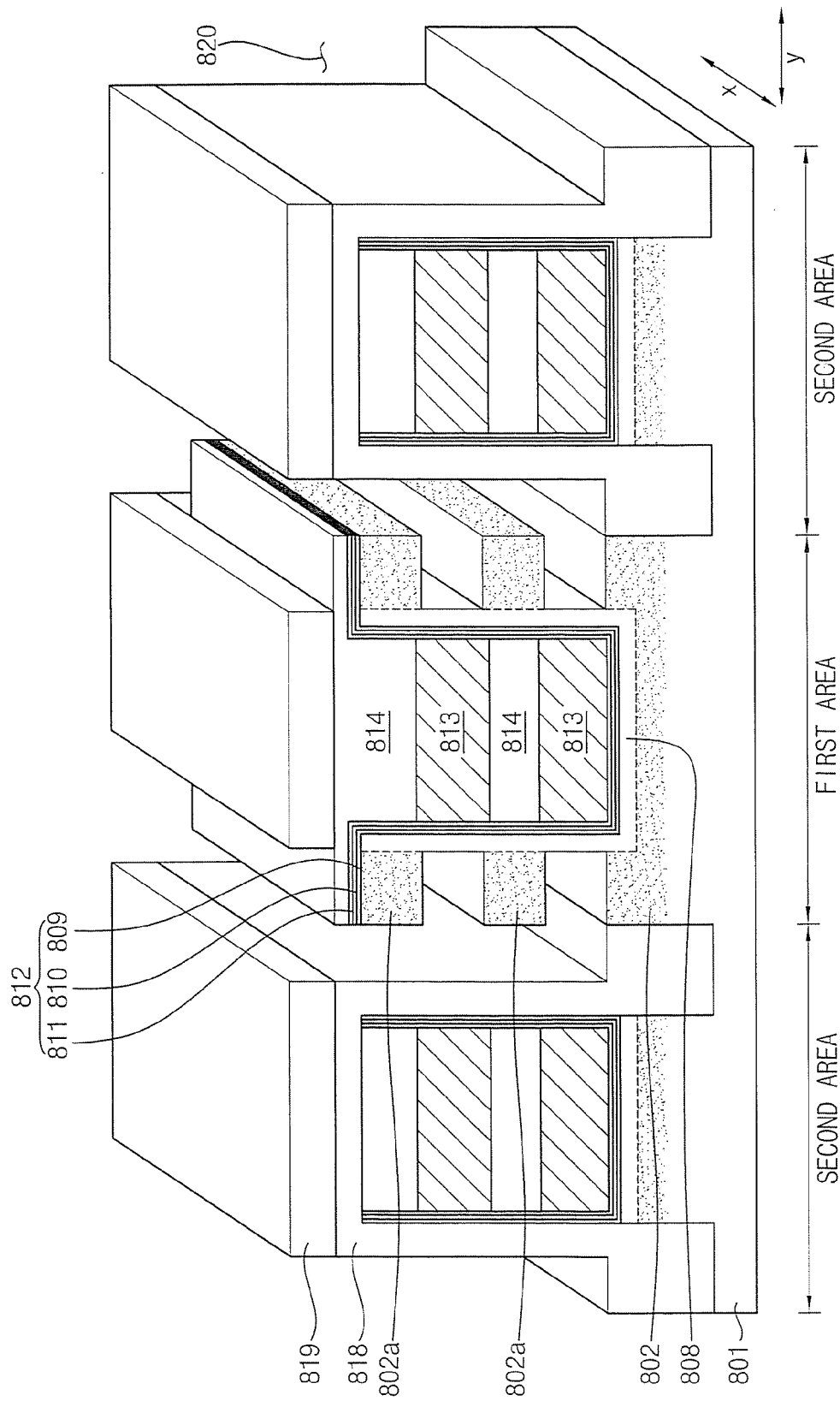
Figure 60:
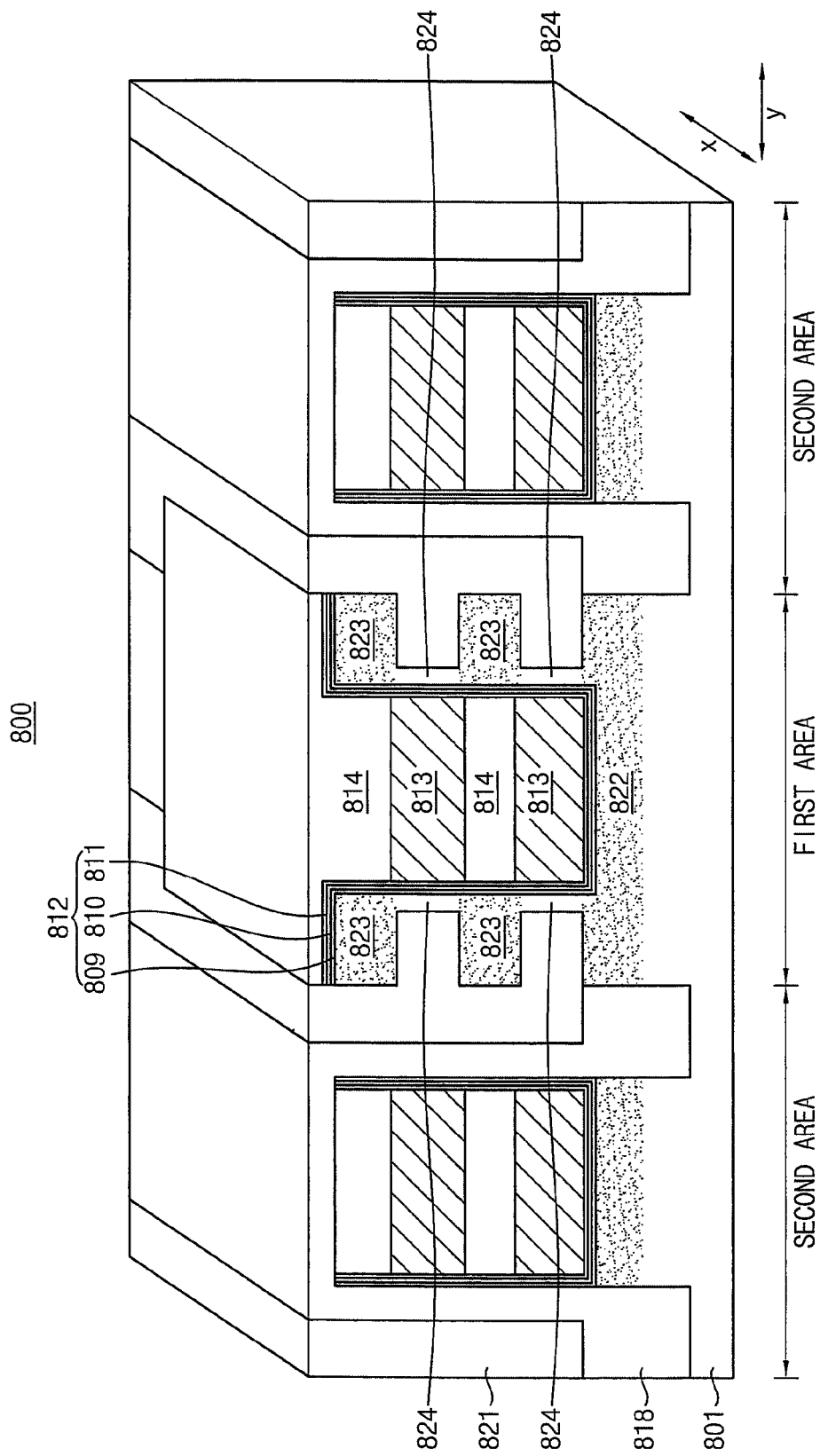

FIGS. 51-60 illustrate operations for forming the transistor 800. Referring to FIGS. 51 and 52, alternating silicon and sacrificial layers 802, 803 are formed on a substrate 801 having first and second areas defined thereon. Referring to FIG. 53, these layers are patterned to form stacks of silicon and sacrificial patterns 802a, 803a and trenches in which a silicon layer 810, a gate insulator layer 812, gate electrodes 813 and insulation regions 814 are formed. As shown in FIGS. 53 and 54, a mask layer 815 is formed on the structure and patterned using a photomask 816 to form a mask pattern 815a. Referring to FIG. 55, the mask pattern 815a is used as an etching mask to form trenches 817. As shown in FIG. 56, the trenches 817 are filled by an insulating layer 818. Referring to FIGS. 57 and 58, the mask pattern 815a is removed and mask patterns 819 formed. The mask patterns 819 are used to form trenches 820 that expose sidewall portions of sacrificial patterns 803a. Referring to FIGS. 59 and 60, the exposed sacrificial patterns 803a are removed, and the resultant gaps and trenches 820 filled with an insulation layer 821.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method of fabricating a transistor, the method comprising:
   forming spaced-apart first and second stacks of interleaved patterns on a substrate, each of the first and second stacks of interleaved patterns comprising at least two semiconductor patterns with at least one sacrificial pattern therebetween;
   forming respective first and second vertical semiconductor lavers conforming to respective opposing sidewalls of the at least two semiconductor patterns and the at least one sacrificial pattern of respective ones of the first and second stacks of interleaved patterns;
   forming respective first and second gate insulators on respective ones of the first and second vertical semiconductor layers;
   forming a conductive gate electrode region extending between the first and second gate insulators;
   removing the at least one sacrificial pattern from each of the first and second stacks of interleaved patterns to form gaps between the at least two semiconductor patterns of the stacks of interleaved patterns; and
   forming respective insulation regions in respective ones of the gaps.

2. The method of claim 1:
   wherein forming spaced-apart first and second stacks of interleaved patterns comprises:
   forming interleaved semiconductor and sacrificial layers on the substrate;
   patterning the semiconductor and sacrificial layers to form a trench defining an active region;
   forming a trench isolation region in the trench; and
   forming a trench bisecting the interleaved layers in the active region to form the spaced-apart first and second stacks of interleaved patterns; and wherein removing the at least one sacrificial pattern from each of the first and second stacks of interleaved patterns comprises;
removing portions of the trench isolation region adjacent outer sidewalls of the first and second stacks of interleaved patterns to expose the at least one sacrificial pattern; and
etching the exposed at least one sacrificial pattern.

3. The method of claim 2:
wherein forming a trench bisecting the interleaved layers in the active region comprises:
forming spaced-apart first and second mask regions on the interleaved layers in the active region; and
etching the interleaved layers in the active region using the first and second mask regions as an etching mask;
wherein forming respective first and second vertical semiconductor layers comprises forming a semiconductor layer on exposed surfaces of the bisecting trench; and
wherein forming respective first and second gate insulators comprises forming a first insulation layer on the semiconductor layer and the first and second mask regions;
wherein forming a conductive gate electrode region extending between the first and second gate insulators comprises forming a conductive region in the bisecting trench between the first and second stacks of interleaved patterns;
wherein removing portions of the trench isolation region adjacent outer sidewalls of the first and second stacks of interleaved patterns is preceded by:
forming a second insulation layer covering the conductive gate electrode region and the first insulation region; and
planarizing, to remove portions of the first insulation layer, the second insulation layer and the first and second mask regions and thereby expose upper patterns of the first and second stacks of interleaved patterns and the trench isolation region.

4. The method of claim 3, wherein forming a semiconductor layer on exposed surfaces of the bisecting trench comprises forming the semiconductor layer by epitaxial growth.

5. The method of claim 3, wherein forming a first insulation layer is preceded by forming an insulation region on the semiconductor layer at the bottom of the bisecting trench, and wherein forming a first insulation layer comprises forming the first insulation layer on the insulation region at the bottom of the trench.

6. The method of claim 2:
wherein forming interleaved semiconductor and sacrificial layers on the substrate comprises sequentially forming a first semiconductor layer, a first sacrificial layer and a second semiconductor layer;
wherein patterning the semiconductor and sacrificial layers to form a trench defining an active region comprises patterning the first semiconductor layer, the first sacrificial layer and the second semiconductor layer to form the trench;
wherein forming a trench bisecting the interleaved layers comprises forming a trench bisecting the first semiconductor layer, the first sacrificial layer and the second semiconductor layer in the active region to form spaced-apart first and second stacks of interleaved patterns, each of which include a first semiconductor pattern, a first sacrificial pattern on the first semiconductor pattern and a second semiconductor pattern on the first sacrificial pattern;
wherein removing the at least one sacrificial pattern from each of the first and second stacks of interleaved patterns comprises:
removing portions of the trench isolation region adjacent outer sidewalls of the first and second stacks of interleaved patterns to expose the first sacrificial pattern; and
etching the exposed first sacrificial pattern.

7. The method of claim 2:
wherein forming interleaved semiconductor and sacrificial layers on the substrate comprises sequentially forming a first semiconductor layer, a first sacrificial layer, a second semiconductor layer, a second sacrificial layer and a third semiconductor layer;
wherein patterning the semiconductor and sacrificial layers to form a trench defining an active region comprises patterning the first semiconductor layer, the first sacrificial layer, the second semiconductor layer, the second sacrificial layer and the third semiconductor layer to form the trench;
wherein forming a trench bisecting the interleaved layers comprises forming a trench bisecting the first semiconductor layer, the first sacrificial layer, the second semiconductor layer, the second sacrificial layer and the third semiconductor layer in the active region to form the spaced-apart first and second stacks of interleaved patterns, each of which include a first semiconductor pattern, a first sacrificial pattern on the first semiconductor pattern, a second semiconductor pattern on the first sacrificial pattern, a second sacrificial pattern on the second semiconductor patterns and a third semiconductor pattern on the second sacrificial pattern;
wherein removing the at least one sacrificial pattern from each of the first and second stacks of interleaved patterns comprises:
removing portions of the trench isolation region adjacent outer sidewalls of the first and second stacks of interleaved patterns to expose the first sacrificial pattern and the second sacrificial pattern; and
etching the exposed first and second sacrificial patterns.

8. The method of claim 1:
wherein forming spaced-apart first and second stacks of interleaved patterns comprises forming spaced apart first, second, third and fourth stacks of interleaved patterns, each including at least two semiconductor patterns with at least one sacrificial pattern therebetween, the first and second stacks of interleaved patterns disposed between the third and fourth stacks of interleaved patterns;
wherein forming respective first and second vertical semiconductor layers comprises forming vertical semiconductor layers conforming to sidewalls of the first, second, third and fourth stacks of interleaved patterns;
wherein forming respective first and second gate insulators on respective ones of the first and second vertical semiconductor layers comprises forming a first insulation layer covering the vertical semiconductor layers;
wherein forming a conductive gate electrode region extending between the first and second gate insulators comprises forming a first conductive region in a trench between the first and second stacks of interleaved patterns, a second conductive region in a trench between the first and third stacks of interleaved patterns, and a third conductive region between the second and fourth stacks of interleaved patterns;
wherein removing the at least one sacrificial pattern from each of the first and second stacks of interleaved patterns comprises:
forming a second insulation layer covering the first, second and third conductive regions and the first insulation layer; and removing portions of the second insulation layer, the first insulation layer, and the first and second stacks of interleaved patterns adjacent the second and third conductive regions to expose at least one sacrificial pattern from each of the first and second stacks of interleaved patterns; and etching the exposed at least one sacrificial pattern from each of the first and second stacks of interleaved patterns.

9. The method of claim 1, further comprising doping the semiconductor patterns prior to forming the first and second vertical channel regions.

10. The method of claim 1, further comprising doping the semiconductor patterns following formation of the gate electrode and prior to forming the respective insulation regions in the respective ones of the gaps.

11. The method of claim 1, further comprising doping the semiconductor patterns after forming the respective insulation regions in the respective ones of the gaps.

12. The method of claim 1, wherein the first and second gate insulators each comprise a charge trap layer disposed between first and second insulation layers.

13. The method of claim 1:

wherein the spaced-apart first and second stacks of interleaved patterns comprise a first semiconductor pattern, a first sacrificial pattern on the first semiconductor pattern, a second semiconductor pattern on the first sacrificial pattern, a second sacrificial pattern on the second semiconductor pattern and a third semiconductor pattern on the second sacrificial pattern;

wherein removing the at least one sacrificial pattern from each of the first and second stacks of interleaved patterns to form gaps between the at least two semiconductor patterns of the stacks of interleaved patterns comprises removing the first and second sacrificial patterns;

wherein forming respective insulation regions in respective ones of the gaps comprises forming respective insulation regions between the first and second semiconductor patterns and between the second and third semiconductor patterns; and wherein the method further comprises doping the second semiconductor pattern differently than the first and third semiconductor patterns to provide a channel extension region between source/drain regions formed in the first and third semiconductor patterns.

14. A method of forming a transistor array, the method comprising:

forming a stack of interleaved layers including at least two semiconductor layers with at least one sacrificial layer therebetween;

patterning the stack of interleaved layers to form spaced apart first, second, third and fourth stacks of interleaved patterns, each including at least two semiconductor patterns with at least one sacrificial pattern therebetween, first and second stacks of interleaved patterns disposed between the third and fourth stacks of interleaved patterns;

forming vertical semiconductor layers on sidewalls of the first, second, third and fourth stacks of interleaved patterns;

forming a gate insulation layer covering the vertical semiconductor layers and the first, second, third and fourth stacks of interleaved patterns;

forming a first gate electrode on the gate insulation layer between the first and third stacks of interleaved patterns, a second gate electrode on the gate insulation layer between on the first and second stacks of interleaved patterns, and a third gate electrode on the gate insulation layer between the second and fourth stacks of interleaved patterns;

forming an insulation layer covering the first, second and third gate electrodes and the gate insulation layer;

removing portions of the insulation layer, the gate insulation layer and portions of the first and second stacks of interleaved patterns adjacent the first and third gate electrodes to expose at least one sacrificial layer in each of the first and second stacks of interleaved patterns;

removing the exposed at least one sacrificial layer in each of the first and second stacks of interleaved patterns to form gaps between semiconductor layers thereof; and forming insulation regions in the gaps.

* * * * *